(12) United States Patent
Schuster et al.

(10) Patent No.: US 10,193,512 B1
(45) Date of Patent: Jan. 29, 2019

(54) PHASE-SHIFTING POWER DIVIDER/COMBINER ASSEMBLIES AND SYSTEMS

(71) Applicant: Werlatone, Inc., Brewster, NY (US)

(72) Inventors: Carl G. Schuster, New Milford, CT (US); Bernard J. Werlau, Brewster, NY (US); Peter A. Kuring, Sherman, CT (US); Ky-Hien Do, Mississauga (CA)

(73) Assignee: Werlatone, Inc., Brewster, NY (US)

( * ) Notice: Subject to any disclaimer, the term of this patent is extended or adjusted under 35 U.S.C. 154(b) by 0 days.

(21) Appl. No.: 15/863,810

(22) Filed: Jan. 5, 2018

(51) Int. Cl.
| | |
|---|---|
| *H03F 1/07* | (2006.01) |
| *H03F 3/60* | (2006.01) |
| *H03F 3/213* | (2006.01) |
| *H03K 5/02* | (2006.01) |
| *H03F 3/195* | (2006.01) |
| *H04B 1/04* | (2006.01) |
| *H03K 5/00* | (2006.01) |

(52) U.S. Cl.
CPC ............ *H03F 3/602* (2013.01); *H03F 3/195* (2013.01); *H03F 3/213* (2013.01); *H03K 5/02* (2013.01); *H03F 2200/336* (2013.01); *H03F 2200/451* (2013.01); *H03K 2005/00286* (2013.01); *H04B 1/0475* (2013.01)

(58) Field of Classification Search
CPC ................................ H03F 1/07; H03F 1/0288
USPC .............................................. 330/124 R, 295
See application file for complete search history.

(56) References Cited

U.S. PATENT DOCUMENTS

| | | | |
|---|---|---|---|
| 3,444,475 A | * | 5/1969 | Seidel .................... H01P 1/213 330/124 R |
| 4,583,061 A | | 4/1986 | O'Shea |
| 5,223,809 A | | 6/1993 | Myer |
| 5,285,175 A | | 2/1994 | Edwards |
| 5,313,174 A | | 5/1994 | Edwards |
| 5,880,648 A | | 3/1999 | Aves et al. |

(Continued)

FOREIGN PATENT DOCUMENTS

CN 105322265 2/2016

OTHER PUBLICATIONS

Hitoshi Hayashi, Hiroshi Okazaki, Atsushi Kanda, Tetsuo Hirota and Masahiro Muraguchi, A Novel Power Combining Configuration without using an Isolator, 1998, 4 pages (pp. 89-92), NTT Wireless Systems Laboratories, Kanagawa, Japan.

(Continued)

*Primary Examiner* — Henry Choe
(74) *Attorney, Agent, or Firm* — Kolisch Hartwell, P.C.

(57) ABSTRACT

In some embodiments, a power divider/combiner assembly includes a divider network, a plurality of amplifiers, and a combiner network. The divider network divides a received divider-network input signal into N divider-network output signals. The divider network includes at least one divider and at least one divider phase-shift circuit. The plurality of amplifiers include N amplifiers for amplifying the divider-network signals. The combiner network is for combining the N amplified signals into a combiner-network output signal. The combiner network includes at least one combiner and at least one combiner phase-shift circuit. Each phase-shift circuit is configured to produce a respective non-zero phase shift between divider output signals or between combiner input signals.

33 Claims, 15 Drawing Sheets

(56) References Cited

U.S. PATENT DOCUMENTS

| | | | |
|---|---|---|---|
| 6,066,983 A * | 5/2000 | Okoro | H03F 1/0277 |
| | | | 330/124 R |
| 6,515,557 B1 | 2/2003 | Wangsvick et al. | |
| 6,900,695 B2 | 5/2005 | Ouacha | |
| 6,982,613 B2 | 1/2006 | Wu et al. | |
| 7,239,215 B2 | 7/2007 | Hardial et al. | |
| 7,254,374 B2 | 8/2007 | Downs | |
| 7,312,751 B1 | 12/2007 | Voyce et al. | |
| 7,573,329 B2 | 8/2009 | Krishnamurthy et al. | |
| 7,755,452 B2 | 7/2010 | Knickerbocker et al. | |
| 7,973,617 B2 | 7/2011 | Yurugi et al. | |
| 8,005,445 B2 | 8/2011 | Kuriyama et al. | |
| 8,154,339 B2 | 4/2012 | Zolghadri et al. | |
| 8,319,583 B2 | 11/2012 | Huettner | |
| 8,427,371 B2 | 4/2013 | Pozgay | |
| 8,427,382 B2 | 4/2013 | Crouch | |
| 8,558,620 B2 | 10/2013 | Fraysse et al. | |
| 8,736,398 B2 | 5/2014 | Caron et al. | |
| 8,995,944 B2 | 3/2015 | Caron | |
| 9,065,163 B1 | 6/2015 | Wu et al. | |
| 9,093,731 B2 | 7/2015 | Correa et al. | |
| 9,136,578 B2 | 9/2015 | Nguyen et al. | |
| 2010/0259325 A1* | 10/2010 | Saunders | H01Q 3/26 |
| | | | 330/124 R |
| 2011/0068865 A1* | 3/2011 | Mohamadi | H01P 5/12 |
| | | | 330/124 R |
| 2015/0200435 A1 | 7/2015 | Guimaraes | |
| 2015/0255845 A1 | 9/2015 | Held et al. | |
| 2015/0340752 A1 | 11/2015 | Nantista et al. | |

OTHER PUBLICATIONS

Eric Klumperink, Rameswor Shrestha, Eisse Mensink, Gerard Wienk, Zhiyu Ru, and Bram Nauta, Multipath Polyphase Circuits and their Application to RF Transceivers, 2007, 4 pages (pp. 273-276), IEEE, IC Design group, CTIT, University of Twente, Enschede, The Netherlands.

Andrei Grebennikov, Power Combiners, Impedance Transformers and Directional Couplers: Part II, Jan. 2008, 7 pages (pp. 42-53), High Frequency Electronics, Summit Technical Media, LLC.

Taylor W. Barton and David J. Perreault, Four-Way Microstrip-Based Power Combining for Microwave Outphasing Power Amplifiers, Oct. 2014, 13 pages (pp. 2987-2998), IEEE Transactions on Circuits and Systems—I, vol. 61, No. 10.

IEEE Xplore, A novel power combining configuration without using an islotator, Jun. 21, 2016, 1 page.

Marki Microwave RF & Microwave Tech No . . . , 6 Ways to Make an N-Way Power Splitter, Jun. 24, 2015, 12 pages, http://www.markimicrowave.com/blog/2015/06/how-to-make-an-n-way-power-splitter/.

* cited by examiner

IDEALIZED AMPLIFIER SIGNAL PHASE SHIFTS

| N | 2 | 3 | 4 | 5 | 6 | 8 | 9 | 16 |
|---|---|---|---|---|---|---|---|---|
| $\Delta\Phi_L$ | 90 | 60 | 45 | 36 | 30 | 22.5 | 20 | 11.25 |
| $\Delta\Phi_1$ | 90 | 60 | 45 | 36 | 30 | 22.5 | 20 | 11.25 |
| $\Delta\Phi_2$ | - | 120 | 90 | 72 | 60 | 45 | 40 | 22.5 |
| $\Delta\Phi_3$ | - | - | 135 | 108 | 90 | 67.5 | 60 | 33.75 |
| $\Delta\Phi_4$ | - | - | - | 144 | 120 | 90 | 80 | 45 |
| $\Delta\Phi_5$ | - | - | - | - | 150 | 112.5 | 100 | 56.25 |
| $\Delta\Phi_6$ | - | - | - | - | - | 13.5 | 120 | 67.5 |
| $\Delta\Phi_7$ | - | - | - | - | - | 157.5 | 140 | 78.75 |
| $\Delta\Phi_8$ | - | - | - | - | - | - | 160 | 90 |
| . | - | - | - | - | - | - | - | - |
| $\Delta\Phi_{15}$ | - | - | - | - | - | - | - | 168.75 |

FIG. 11

PHASE-SHIFTING POWER DIVIDER/COMBINER ASSEMBLIES AND SYSTEMS

BACKGROUND

Intermodulation (IM) is the production in an electrical device of frequencies that are the sums or differences of frequencies of different inputs or of their harmonics. Reverse intermodulation (IM) products are unintended signals that are produced by the mixing of harmonics of an unwanted signal received on an output of the electrical device with the fundamental frequency of a primary signal being output on the electrical device. The output signal can include reverse IM products as well as the primary signal. As the frequency spectrum gets more crowded, due to the demands and therefore the deployments of more wireless communication, imaging, and sensor systems, the issues with reverse IM products become more pronounced and damaging to the primary signal or to unintended recipients of the output reverse IM products.

Reverse IM products are due to the reception of nearby external signals as is illustrated in FIG. 1. For example, a transmitter 20 injects some of its energy, having a frequency fb, into a nearby transmitting antenna 22 of a transmitter 24, which transmits a primary signal at frequency fa. The external energy with frequency fb travels in the reverse direction from the antenna 22 of transmitter 24 toward an output port 26 of a power amplifier 28 of transmitter 24. The unwanted energy from transmitter 20 mixes with energy emerging from nonlinear transistors inside power amplifier 28 of transmitter 24 to create a number of IM products.

By definition, the IM products are formed by the mixing of the fundamental frequencies and harmonics of the primary and received external signals, i.e., signals having frequencies fa and fb in this example. The more damaging IM products are those that have frequencies near the fundamental frequencies, because such IM products usually cannot be easily filtered out without the use of extremely high-Q filters, which are very expensive if they even exist. For example, third-order IM products are formed by the mixing products 2fa-fb and 2fb-fa. Similarly, the fifth, seventh, and ninth orders are formed by 3fa-2fb and 3fb-2fa, 4fa-3fb and 4fb-3fa, and 5fa-4fb and 5fb-4fa. Higher order IM products also exist and add to spectral congestion and can interfere with systems being deployed. For the sake of clarity, only the third-order IM products are depicted in FIG. 1, but it must be noted that higher order IM products may also exist and can cause issues.

These IM products get propagated by the antenna 22 associated with transmitter 24 and pollute the transmitter's output spectrum with undesired spectral content, which may interfere with other transmitters and receivers that happen to be within a path of propagation of energy from the antenna 22 of transmitter 24. The propagated IM products can interfere with nearby external electronic systems, and may cause these systems to cease from functioning properly.

FIG. 2 illustrates a frequency spectrum of the energy transmitted by transmitter 24, including the primary signal at frequency fa, one interfering signal at frequency fb, and several IM products. Representative third, fifth, seventh, and ninth order IM products above the primary frequency are identified as IM3a (2fa-fb), IM5a (3fa-2fb), IM7a (4fa-3fb), and IM9a (5fa-4fb). Representative third, fifth, seventh, and ninth order IM products below the primary frequency are identified as IM3b (2fb-fa), IM5b (3fb-2fa), IM7b (4fb-3fa), and IM9b (5fb-4fa). The frequencies of the signal components are shown as a function of relative signal power level for a primary frequency, fa, of 30.5 MHz and an interfering signal, fb, having a fundamental frequency of 30 MHz.

Referring again to FIG. 1, external receiver 30 may be located along the propagation path of the primary signal transmitted by transmitter 24. Receiver 30 then becomes an unintended receiver of the signal transmitted by transmitter 24. Receiver 30 may have a receive channel including, for example, the frequency fc=2fa-fb (IM3a) and thereby may receive this third order IM product from transmitter 24.

The IM products near the fundamental frequencies are difficult to deal with because such IM products usually cannot be easily filtered out without the use of extremely high-Q filters, which are expensive, if they exist. Furthermore, there may be a second transmitter (or more), such as interfering transmitter 32 illustrated in dashed lines in FIG. 1. Transmitter 32 may transmit energy having a fundamental frequency fd that is also received by the antenna 22 of transmitter 24. This second interfering signal may cause IM products to be produced that involve fundamental and harmonic signals of all three signals fa, fb, and fd.

With the deployment of more wireless systems and services in densely populated areas, it is very probable that more than one tone can interfere with the transmitter of interest. The higher the number of interference tones, the more IM products are produced and thus the worse the spectral pollution is.

SUMMARY

In some embodiments, a power divider/combiner assembly includes a divider network, a plurality of amplifiers, and a combiner network. The divider network is for dividing a received divider-network input signal into N divider-network output signals, where N is an integer greater than seven. The divider network includes at least one divider and at least one of each of first, second, and third divider phase-shift circuits. Each divider has a divider input and a plurality of divider outputs and is configured to divide a divider input signal on the divider input into a divider output signal on each of the plurality of divider outputs. Each divider phase-shift circuit is configured to produce a respective non-zero phase shift between divider output signals on an associated pair of divider outputs of an associated divider of the at least one divider. Each first divider phase-shift circuit produces a first phase shift, each second divider phase-shift circuit produces a second phase shift that is more than the first phase shift, and each third divider phase-shift circuit produces a third phase shift that is more than the second phase shift.

In this example, the plurality of amplifiers include N amplifiers, with each of the N amplifiers amplifying one of the N divider-network output signals into a respective amplified signal. The combiner network is for combining the N amplified signals into a combiner-network output signal. The combiner network includes at least one combiner and at least one of each of first, second, and third combiner phase-shift circuits. Each combiner has a plurality of combiner inputs and a combiner output and is configured to combine combiner input signals on the plurality of combiner inputs into a combiner output signal on the combiner output. Each combiner phase-shift circuit is configured to produce a respective non-zero phase shift between combiner input signals on an associated pair of combiner inputs of an associated combiner of the at least one combiner, each first combiner phase-shift circuit producing the first phase shift, each second combiner phase-shift circuit producing the second phase shift, and each third combiner phase-shift circuit producing the third phase shift.

In some embodiments, a combiner system includes first and second power divider/combiner assemblies and a system combiner. The first power divider/combiner assembly is power divider/combiner assembly as described above for amplifying a first system input signal. The second power divider/combiner assembly is also a power divider/combiner assembly as described above and is for amplifying a second system input signal. The first and second system input signals are non-coherent. The system combiner has first and second system combiner inputs and a system combiner output. The system combiner is configured to combine the amplified first system input signal on the first system combiner input and the amplified second system input signal on the second system combiner input into a system combiner output signal on the system combiner output.

In some embodiments, a power divider/combiner assembly includes a divider network, N amplifiers, and a combiner network, where N is an integer greater than one. The divider network is for dividing a received divider-network input signal into N divider-network output signals. The divider network includes at least one divider and at least one divider phase-shift circuit. Each divider has a divider input and a plurality of divider outputs and is configured to divide a divider input signal on the divider input into a divider output signal on each of the plurality of divider outputs. A first divider phase-shift circuit of the at least one divider phase-shift circuit is configured to produce a non-zero first phase shift, $\Delta\phi_1$, between a first divider output signal on a first divider output of the plurality of divider outputs of a first divider of the at least one divider and a second divider output signal on a second divider output of the first divider. $(0.7)n\Delta\phi_L \leq \Delta\phi_1 \leq (0.95)n\Delta\phi_L$ or $(1.05)n\Delta\phi_L \leq \Delta\phi_1 \leq (1.3)n\Delta\phi_L$, where $\Delta\phi_L = 180°/N$ and n is a positive integer.

Each amplifier of the N amplifiers amplifies one of the N divider-network output signals into a respective amplified signal. The combiner network is for combining the N amplified signals into a combiner-network output signal. The combiner network includes at least one combiner and at least one combiner phase-shift circuit. Each combiner has a plurality of combiner inputs for conducting a corresponding plurality of respective combiner input signals and a combiner output for conducting a combiner output signal. At least a first combiner phase shift circuit of the at least one combiner phase shift circuit is configured to shift by the first phase shift the phase of a first combiner input signal on a first combiner input of a respective combiner relative to a phase of a second combiner input signal on a second combiner input of the respective combiner.

In some embodiments, a combiner system includes a system combiner and first and second power divider/combiner assemblies as just described. The first power divider/combiner assembly amplifies a first system-input signal, and the second power divider/combiner assembly amplifies a second system-input signal. The first and second system-input signals are non-coherent. The system combiner has first and second system-combiner inputs and a system-combiner output, and is configured to combine the amplified first system-input signal on the first system-combiner input and the amplified second system-input signal on the second system-combiner input into a system-output signal on the system-combiner output.

In some embodiments, a power divider/combiner assembly includes a divider network, N amplifiers, and a combiner network. The divider network is for dividing a received divider-network input signal into N divider-network output signals. N is an integer greater than two. The divider network includes at least a first divider and at least one of each of at least first and second divider phase-shift circuits. The first divider has a divider input and at least three divider outputs and is configured to divide a divider input signal on the divider input into a divider output signal on each of the at least three divider outputs. One of the first divider phase-shift circuits is configured to produce a non-zero first phase shift between divider output signals on first and second divider outputs of the first divider. One of the second divider phase-shift circuits is configured to produce a second phase shift between the divider output signal on the first divider output and a divider output signal on a third divider output of the first divider. The second phase-shift is more than the first phase shift. Each amplifier amplifies one of the N divider-network output signals into a respective amplified signal.

The combiner network is for combining the N amplified signals into a combiner-network output signal. The combiner network includes at least a first combiner and at least one of each of at least first and second combiner phase-shift circuits. The first combiner has at least three combiner inputs and a combiner output. The first combiner is configured to combine combiner input signals on the at least three combiner inputs into a combiner output signal on the combiner output. One of the first phase-shift circuits is configured to produce the first phase shift between combiner input signals on first and second combiner inputs of the first combiner. One of the second phase-shift circuits is configured to produce the second phase shift between the combiner input signal on the first combiner input and a combiner input signal on a third combiner input.

Features, functions, and advantages may be achieved independently in various embodiments of the present disclosure, or may be combined in yet other embodiments, further details of which can be seen with reference to the following description and drawings.

BRIEF DESCRIPTION OF THE DRAWINGS

FIG. 11 is a table listing objective phase shifts of amplifier signals for various N-way divider/combiner assemblies.

DETAILED DESCRIPTION

Various embodiments of a divider/combiner assembly having a divider network, a plurality of amplifiers, a combiner network, or a combination are described below and illustrated in the associated drawings. Unless otherwise specified, a divider/combiner assembly and/or its various components may, but are not required to, contain at least one of the structure, components, functionality, and/or variations described, illustrated, and/or incorporated herein. Furthermore, the structures, components, functionalities, and/or variations described, illustrated, and/or incorporated herein may, but are not required to, be included in other apparatuses, such as transmitters. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

As the frequency spectrum gets more crowded, due to the demands of increasing numbers of wireless communication devices, imaging, and sensing systems, the issues with reverse intermodulation products (reverse IM products) become more pronounced and damaging. As described above, the issues with reverse IM products are numerous, severe and not easily mitigated. As the useable spectral bandwidths get more crowded, these issues are exacerbated. In the United States (US), the Federal Communications Commission (FCC) places the responsibility of ensuring the cleanliness of the output spectrum with the owners of various wireless systems and services, by strictly enforcing spectral mask regulations. It is becoming increasingly difficult and costly to ensure that a system meets a required output-limiting spectral mask for each location and at any arbitrary time interval.

Figure 3:
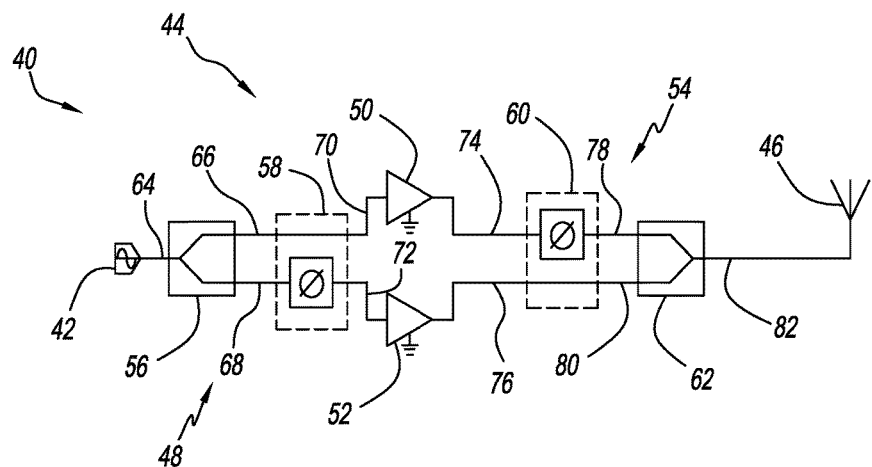
FIG. 3 is an exemplary schematic diagram of a transmitter having a two-way divider/combiner assembly with phase shift.

IM products may be controlled by the use of phase-shift networks in signal dividers and combiners, such as those used in power amplifiers of transmitters. FIG. 3 illustrates an example of a transmitter shown generally at 40. Transmitter 40 includes an input port 42, a single-stage, N-way power divider/combiner assembly 44, and an antenna 46. As used herein, N is a positive integer. In the example illustrated in FIG. 3, N=2, which corresponds to a two-way divider/combiner assembly 44 having two amplifier signal-lines. Power divider/combiner assembly 44 includes a divider network 48, amplifiers 50, 52, and a combiner network 54. Divider network 48 includes a two-way splitter or divider 56 and a divider phase-shift circuit 58. Combiner network 54 includes a combiner phase-shift circuit 60 and a two-way combiner 62.

Divider 48 receives an input signal on a divider input 64 from input port 42. Divider 56 divides the input signal into two output signals on divider outputs 66, 68. Phase-shift circuit 58 shifts the phase of the output signal on divider output 68 relative to the phase of the output signal on divider output 66. This is preferably in the form of a phase-shift circuit that maintains a phase differential, $\Delta\phi_1$, between the two outputs at a relatively constant value. As is known in the art, the phase-shift circuit may affect both outputs or it may simply affect one output, producing a net phase-shift differential, $\Delta\phi_1$. For example, a delay line on one output may be used, or a phase-shift circuit that affects both circuits may be used. An example of such a phase-shift circuit is shown in U.S. Pat. No. 8,542,080.

The two divider output signals output from phase-shift circuit 58 on divider network outputs 70, 72, are input to respective transistors of amplifiers 50, 52. If the signal paths from input port 42 to the amplifiers are the same, the divider output signals are input to the amplifiers with the phase differential $\Delta\phi_1$ between the two signals.

The amplifiers can also shift the phases of the respective signals. The amplifiers may not all shift the signal phases by the same amount. For example, differences between the amplifiers can result from the use of different types of transistors, differences introduced during fabrication or differences in the way the amplifiers are packaged. Amplifier 50 may produce a signal phase shift of $\Delta\phi_{A1}$ and amplifier 52 may produce a signal phase shift $\Delta\phi_{A2}$. As a result, there can be a further phase differential, $\Delta\phi_{A1}-\Delta\phi_{A2}=\Delta\phi_A$, between amplifiers 50, 52 contributed by the differences in the amplifiers.

In the example shown, the signal output from amplifier 50 may have a phase differential of $\Delta\phi_1+\Delta\phi_A$ compared to the signal output from amplifier 52, where $\Delta\phi_A$ may increase or decrease the net phase differential, depending on the relative effects of amplifiers 50 and 52.

The amplified signals are input into combiner network 54 on combiner network inputs 74, 76. The combiner network input signal on combiner network input 74 is further phase-shifted by $\Delta\phi_1$ by phase-shift network 60 relative to the combiner network input signal on combiner input 76. The phase shifted signals are input to combiner 62 on combiner input 78 and combiner input 80 having a net phase differential of $\Delta\phi_A$. The two signals are combined and output from phase-shift network 60 on combiner output 82, which output is also the output of divider/combiner assembly 44. Assuming $\Delta\phi_A$ is fairly small, the two signals should have close phases, and in some examples, have substantially the same phase, i.e., are coherent, when combined onto combiner output 82.

An external interfering signal received on antenna 46 on the other hand divides into two signals in combiner 62. The divided interfering signals pass through phase-shift network 60 twice as they travel to respective ones of amplifiers 50 and 52, where they are reflected back towards antenna 46. The phase differential is thus applied twice to the two signals before being transmitted by antenna 46, causing them to have a substantial phase differential of $2\Delta\phi_1'$ plus $2\Delta\phi_A'$, where the prime indicates that the phase differentials are different than those that applied to the primary signal since the interfering signal is a different frequency and only passes through the output circuit of the amplifiers. The outgoing interfering signals are thus non-coherent when combined in combiner 62. Also, the numerous intermodulation (IM) products produced in the amplifiers go through respective different phase shifts, making them out of phase when combined in combiner 62.

Values for the phase-shift differentials applied by phase-shift circuits 58, 60 are preferably selected to compensate for the amplifier non-linearity and phase shifts by attenuating the reverse IM products in the output signal.

Figure 4:
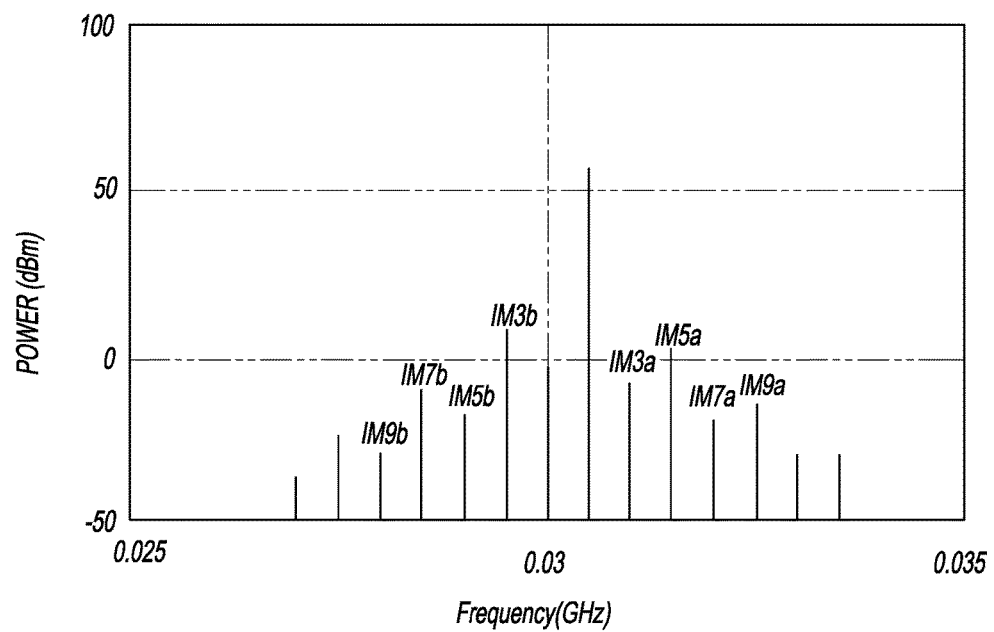
FIG. 4 is a representative power spectrum of an output signal including reverse intermodulation products for a single interference signal as produced by the divider/combiner assembly of FIG. 3 with 90-degree phase shifts.

FIG. 4 illustrates a power spectrum for single-stage power divider/combiner assembly for a primary signal having a frequency of 30.5 MHz, and a single interference signal having a frequency of 30.0 MHz for a phase shift, $\Delta\phi_1$, of 90°. The frequencies of several IM products are also shown. It is seen that there is significant reduction in the power levels of the interference signal and some of the IM products compared to the spectrum of FIG. 2 in which there were no phase shifts.

Figure 5:
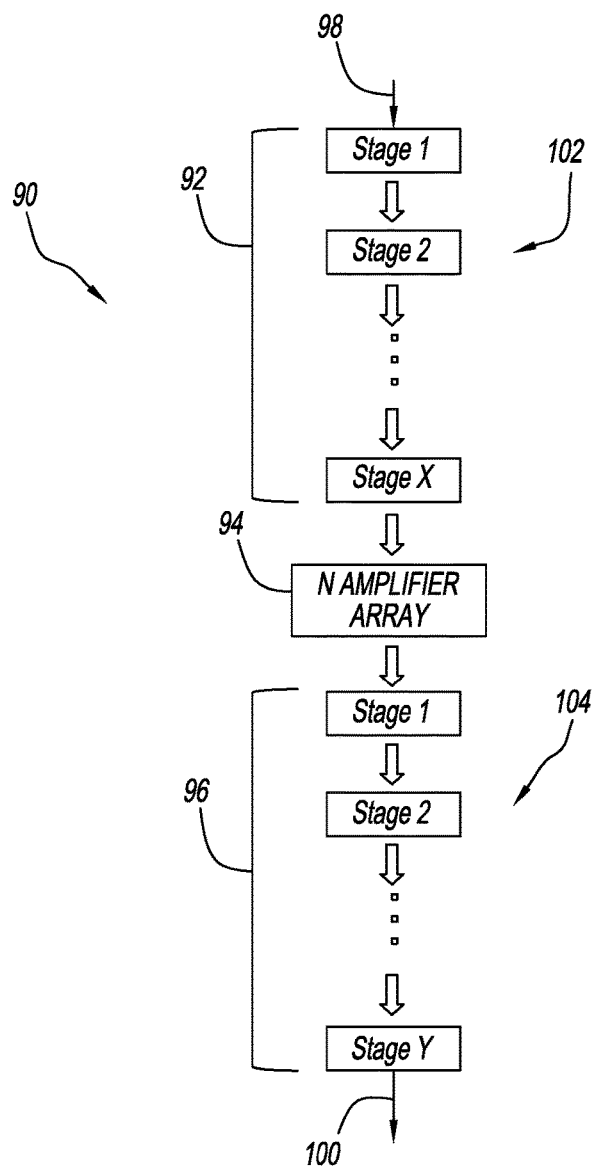
FIG. 5 is an exemplary block diagram illustrating signal flow in a multi-stage divider/combiner assembly.

FIG. 5 is a block diagram illustrating in a general sense a power divider/combiner assembly shown generally at 90. Power divider/combiner assembly 90 includes a divider network 92, an array 94 of N amplifiers, and a combiner network 96. Divider network 92 receives an input signal on an input 98, and combiner network 96 outputs an output signal on an output 100.

Divider network 92 can include one or more divider network stages 102 that in combination divide the signal into N divider output signals that are input into respective amplifiers of amplifier array 94. In this example, divider network 92 includes X divider network stages 102, where X≥1. Combiner network 96 can include one or more combiner network stages 104 that in combination combine the N amplified signals into the output signal. In this example, combiner network 96 includes Y combiner network stages 104, where Y≥1. X and Y are positive integers and may or may not be equal.

Figure 6:
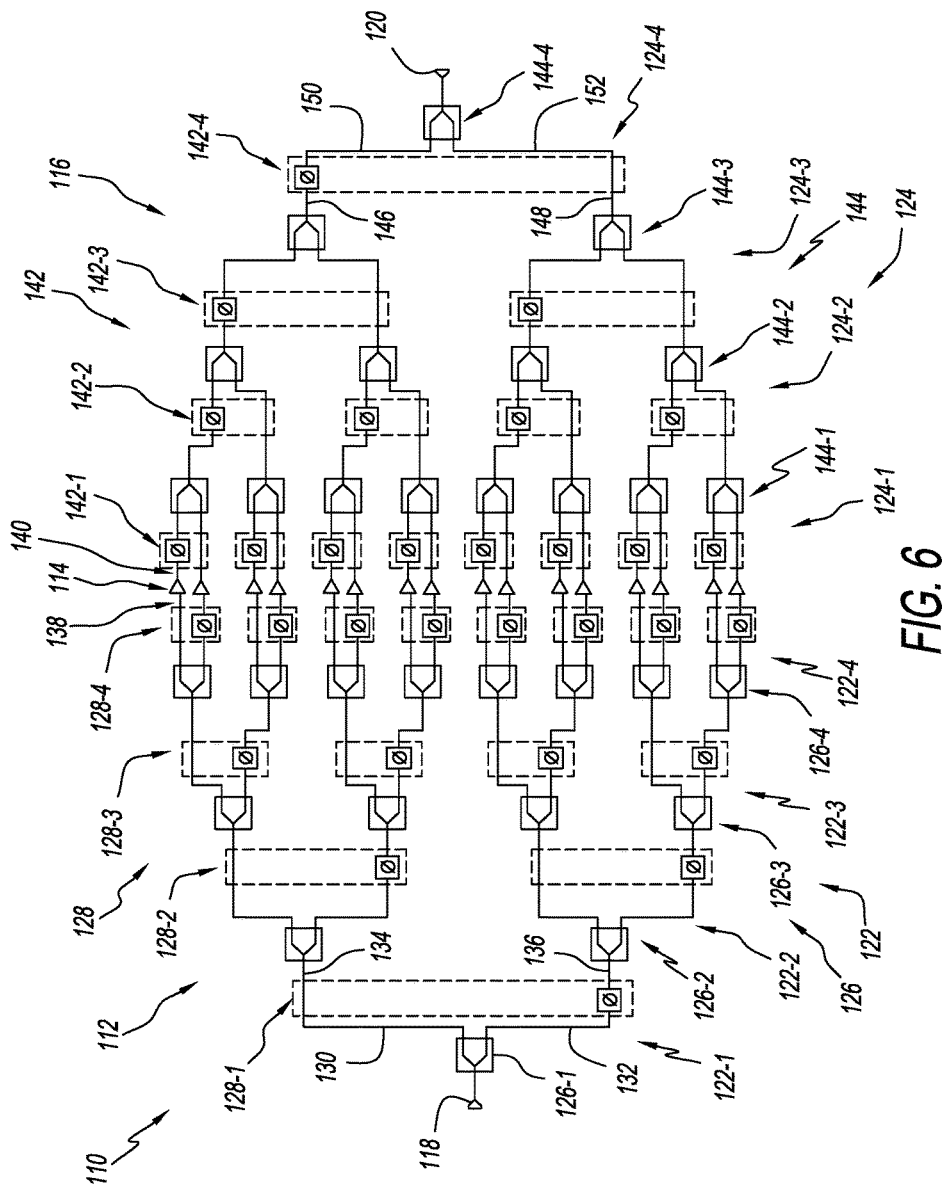
FIG. 6 is an exemplary schematic diagram of a four-stage 8-way divider/combiner assembly with phase shift or a 16-way divider/combiner assembly with phase shift in which each amplifier is itself a two-stage divider/combiner assembly as shown in FIG. 3.

FIG. 6 shows a schematic diagram of a 16-way coherent binary embodiment of a power divider/combiner assembly 110 including a divider network 112, an array of N=16 amplifiers 114, and a combiner network 116. Divider network 112 receives an input signal on an input 118, and combiner network 116 outputs an output signal on an output 120. Input 118 is a divider/combiner-assembly input as well as a divider network input.

Divider network 112 includes X=4 two-way or binary divider network stages 122 that in combination divide the signal into 16 divider output signals that are input into respective amplifiers 114 in the amplifier array. Combiner network 116 includes Y=4 two-way or binary combiner network stages 124 that in combination combine the 16 amplified signals output from the array of amplifiers 114 into the output signal on output 120. In this example, the divider network and the combiner network have the same number of stages.

The divider network stages 122 include first, second, third, and fourth divider network stages 122-1, 122-2, 122-3, and 122-4, respectively. Each divider network stage 122 includes one or more divider 126 and one or more divider phase-shift circuit 128. First divider network stage 122-1 includes a single two-way divider 126-1 and an associated divider phase-shift circuit 128-1. Divider 126-1 divides an input signal received on input 118, which is also referred to as a divider input, and produces two equal divider output signals on divider signal lines 130, 132, which are also referred to as associated divider outputs. Divider phase-shift circuit 128-1 shifts the phase of the output signal on divider output 132 relative to the phase of the output signal on divider output 130 and outputs the phase-adjusted signals on divider signal lines 134, 136, which signal lines are also referred to as divider phase-shift circuit outputs. First divider network stage 122-1 thus divides a single input into two phase-adjusted outputs.

In general, each divider 126-X of each stage X divides a divider input signal received on a respective divider input and produces two equal divider output signals on two associated divider outputs. Each divider phase-shift circuit 128-X correspondingly shifts the phase of the divider output signal on one of the divider outputs relative to the phase of the divider output signal on the other divider output of the associated divider.

Second divider network stage 122-2 includes two two-way dividers 126-2 and two respective associated divider phase-shift circuits 128-2. The two outputs of the first stage become two inputs to the second divider network stage. The second divider network stage divides the two inputs into four phase-adjusted outputs.

Third divider network stage 122-3 includes four two-way dividers 126-3 and four respective associated divider phase-shift circuits 128-3. The four outputs of the second stage become four inputs to the third divider network stage. The third divider network stage divides the four inputs into eight phase-adjusted outputs.

Fourth divider network stage 122-4 includes eight two-way dividers 126-4 and eight respective associated divider phase-shift circuits 128-4. The eight outputs of the third stage become eight inputs to the fourth divider network stage. The fourth divider network stage thus divides eight inputs into sixteen phase-adjusted outputs. The sixteen divider outputs from the fourth stage are also divider network outputs 138 of divider network 112.

In this embodiment, there are 16 amplifiers 114, there being one amplifier for each divider network output 138. Amplifiers 114 may be any amplifier suitable for a particular application. In a particular embodiment, lateral double-diffused MOSFET (LDMOS) transistors are used. Each amplifier produces an amplified amplifier output 140.

Combiner network 116 provides selective phase shifting and staged combining of the 16 amplified amplifier outputs 140. The combiner network stages 124 include first, second, third, and fourth combiner network stages 124-1, 124-2, 124-3, and 124-4, respectively. Each combiner network stage 124 includes one or more combiner phase-shift circuit 142 and one or more combiner 144.

In general, each combiner phase-shift circuit 142-Y of each stage Y shifts the phase of an input signal on one of two combiner phase-shift circuit inputs relative to a phase of an input signal on the other combiner phase-shift circuit input. The combiner phase-shift circuit 142-Y outputs the phase-shifted signals on two corresponding combiner phase-shift circuit outputs. The combiner phase-shift circuit outputs are combiner inputs for the associated combiner 144-Y. Each combiner 144-Y combines the signals on the two combiner inputs and produces a combiner output signal on one associated combiner output.

First combiner network stage 124-1 includes eight phase-shift circuits 142-1 and eight respective associated two-way combiners 144-1. The 16 amplifier outputs from amplifiers 114 are the 16 inputs to the first combiner network stage. First combiner network stage thus combines sixteen combiner network inputs into eight combiner outputs.

Second combiner network stage 124-2 includes four phase-shift circuits 142-2 and four respective associated two-way combiners 144-2. The eight combiner outputs of the first combiner stage, as combiner phase-shift circuit inputs of the second stage, are phase adjusted and combined to form four combiner outputs.

Third combiner network stage 124-3 includes two phase-shift circuits 142-3 and two respective associated two-way combiners 144-3. The four combiner outputs of the second stage become two combiner phase-shift circuit inputs to the third combiner network stage. The third-stage combiners combine four phase-adjusted combiner inputs into two combiner outputs on combiner signal lines 146, 148.

Fourth combiner network stage 124-4 includes a single combiner phase-shift circuit 142-4 and an associated two-way combiner 144-4. Combiner phase-shift circuit 142-4 shifts the phase of a signal on combiner signal line 146, as a combiner phase-shift circuit input, relative to the phase of a signal on combiner signal line 148, also as a combiner phase-shift circuit input. The combiner phase-shift circuit 142-4 outputs the phase-shifted signals on corresponding combiner phase-shift circuit outputs on combiner signal lines 150, 152. The combiner phase-shift circuit outputs are combiner inputs for combiner 144-4. Combiner 144-4 combines the signals on the two combiner inputs and produces a single combiner output signal on divider/combiner assembly output 120. Divider/combiner assembly output 120 is also a combiner output of combiner 144-4 and a combiner network output of combiner network 116.

In an embodiment of divider/combiner assembly 110, the phase-shift circuits or networks (PSNs) provide a different phase adjustment at each of the four stages of each of divider network 112 and combiner network 116, to mitigate reverse IM products. Divider phase-shift circuit 128-1 and combiner phase-shift circuit 142-4 produce a relative phase adjustment of 9 degrees. Divider phase-shift circuit 128-2 and combiner phase-shift circuit 142-3 produce a relative phase adjustment of 23 degrees. Divider phase-shift circuit 128-3 and combiner phase-shift circuit 142-2 produce a relative phase adjustment of 50 degrees. Divider phase-shift circuit 128-4 and combiner phase-shift circuit 142-1 produce a relative phase adjustment of 86 degrees. The values of the PSNs were determined by an optimization algorithm based upon the specific non-linear characteristics of the LDMOS transistor used in this amplifier design. With a different transistor, be it a different brand or a different layout, the values of the PSNs may be different to accommodate differences in parameter variations and behavior as functions of power drive level, frequency, number and nature of interference tones, and mitigation objective.

In this example, the different dividers 126-X are each associated with a different one of divider phase-shift circuits 128-X. Correspondingly, the different combiners 144-Y are each associated with a different one of combiner phase-shift circuits 142-Y. The phase-shift circuits are arranged with lower phase-shift values closer to the divider network input and to the combiner network output. This configuration may provide greater power-handling capability than other configurations because phase-shift circuits that provide the lower phase-shift values may be selected that are capable of conducting more power than phase-shift circuits that provide higher phase-shift values. Other arrangements of the phases provided by the phase-shift circuits may also be used without compromising the levels of IM product mitigation. The recombined signals are sufficiently close in phase or are substantially coherent when the combiner network is a mirror image of the divider network as is the case with divider/combiner assembly 110.

In this example, the phase shifts are selected to provide favorable reverse IM product mitigation. It will also be seen that each of phase shifts of 9, 23, and 50 degrees is less than two thirds of the next higher phase shifts of 23, 50, and 86 degrees, respectively. None of these phase shifts divides evenly into 360 degrees. Also, none of the lower phase shifts of 9, 23, or 50 degrees divides evenly into the next higher phase shifts of 23, 50, or 86 degrees, respectively. The phase shifts of 9 degrees and 23 degrees are each less than 45 degrees. The phase shift of 23 degrees is between 30 degrees and 16 degrees. None of the phase shifts is equal to an integral multiple of $\Delta\phi_L=180°/N$, which in this example is 11.25 degrees.

In some examples, the first or lowest phase shift is preferably $\Delta\phi_1=180°/N+/-30\%$ or about 7 degrees to 15 degrees for N=16. The second phase shift is preferably $\Delta\phi_2=2(180°/N)+/-30\%$ or about 15 degrees to 30 degrees for N=16. The third phase shift is preferably $\Delta\phi_3=4(180°/N)+/-30\%$ or about 30 degrees to 60 degrees for N=16. The fourth phase shift is preferably $\Delta\phi_4=8(180°/N)+/-30\%$ or about 60 degrees to 120 degrees for N=16. In general terms, the phase shift, for stage n of $N^{1/2}$ stages, at the amplifiers is preferably $\Delta\phi_n=(n-1)^2(180°/N)+/-30\%$ for integer n, where $1<n\leq N^{1/2}$. In further examples, the phase shift $\Delta\phi n$ at each stage n is in the range $(0.7)n\Delta\phi_L \leq \Delta\phi_n \leq (0.95)n\Delta\phi_L$ or in the range $(1.05)n\Delta\phi_L \leq \Delta_n \leq (1.3)n\Delta\phi_L$, where $\Delta\phi_L=180°/N$ and n is a positive integer less than or equal to $N^{1/2}$. In some examples, $\Delta\phi_n \leq (0.9)n\Delta\phi_L$ or $\Delta\phi_n \geq (1.1)n\Delta\phi_L$.

Figure 1:
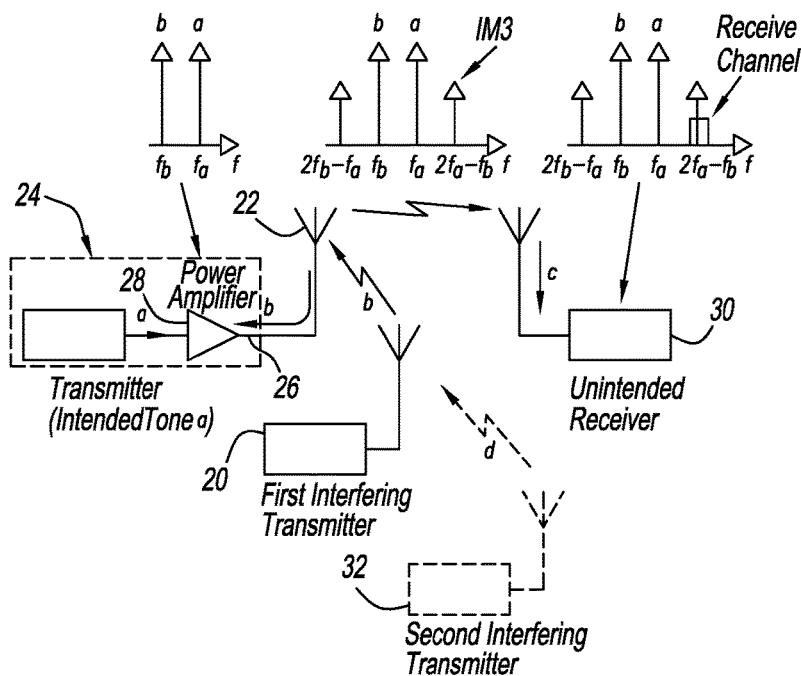
FIG. 1 is a general diagram illustrating the generation of reverse intermodulation products due to the reception at a transmitter of nearby external signals.
Figure 2:
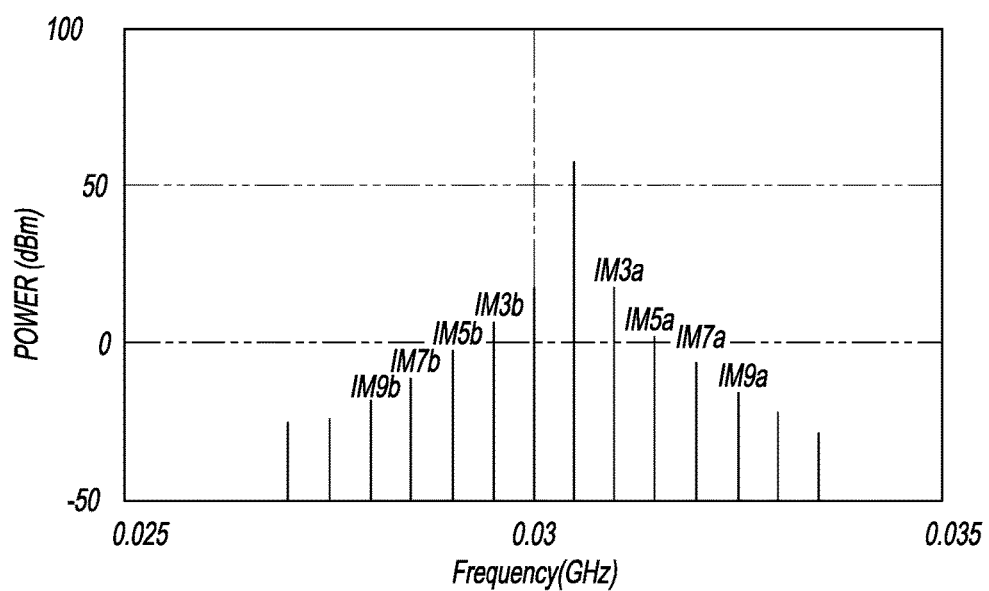
FIG. 2 is a representative power spectrum of a transmitter transmission signal including reverse intermodulation products.
Figure 7:
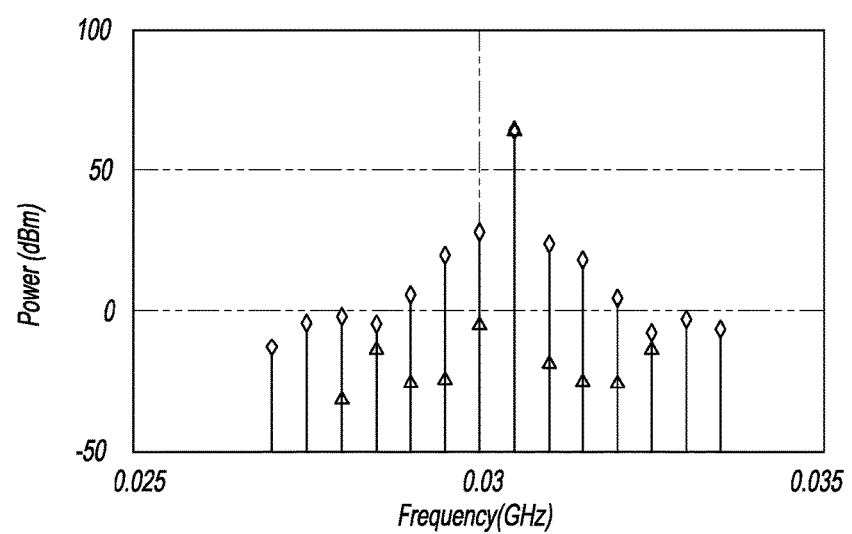
FIG. 7 is a representative power spectrum of an output signal including reverse intermodulation products for a single interference signal as produced by the divider/combiner assembly of FIG. 6 with and without phase shifts.

FIG. 7 illustrates a frequency spectrum of the energy transmitted by transmitter 24 of FIG. 1, having no phase-shift circuits, for a primary tone at 30.5 MHz and one interference tone at 30.0 MHz with no IM mitigation, as illustrated in FIG. 2. The unmitigated energy values of transmitter 24 are indicated by the diamonds at the top of the spectral lines. Imposed on the spectral lines are triangles that indicate the level of energy transmitted by a transmitter having divider/combiner assembly 110 as described with reference to FIG. 6. It can be seen that divider/combiner assembly 110 provides a significant and consistent reduction in reverse IM products.

Figure 8:
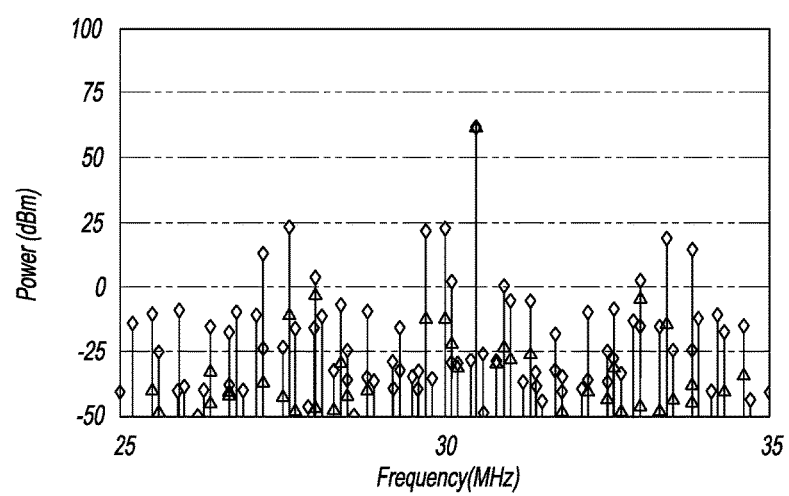
FIG. 8 is a representative power spectrum of an output signal including reverse intermodulation products produced by two interference signals as produced by the divider/combiner assembly of FIG. 6 with and without phase shifts.

FIG. 8 illustrates a frequency spectrum of the energy transmitted by transmitter 24 of FIG. 1 for a situation in which transmitter 24 transmits a primary tone at 30.5 MHz and receives two interference tones at 29.7 MHz and 30.0 MHz. In this simulation, the number of reverse IM products are much more numerous because the interference tones mix with the primary tone and with each other as well. The unmitigated divider/combiner assembly response for transmitter 24 is again represented by the diamond symbols at the tops of the spectral lines. The triangles indicate the level of energy transmitted by a transmitter having divider/combiner assembly 110 with divider and combiner phase-shift circuits as described with reference to FIG. 6. With the simulation results superimposed on top of one another, again it can be seen that divider/combiner assembly 110 provides a significant and consistent reduction in reverse IM products at the output of the power amplifier, creating a much cleaner transmitter spectral output. Similar results may also be achieved when there are more than two interference tones.

The substantial mitigation of reverse IM products resulting with the deployment of PSNs in divider/combiner assembly 110 happens because the phase-shift networks work in concert to route the IM products to isolation resistors inside the combiners in combiner network 116. The IM products are created by the non-linear behavior of the transistors mixing the interference tone(s) with the primary tone and, if there is more than one interference tone, with each other. The divider/combiner assembly with PSNs prevents much of the energy from these IM products from reaching the antenna.

The values of phase shifts in the PSNs that achieve comparatively low IM content at the output port for communication to the antenna are determined during simulation. If a chosen set of phase shifts in the PSNs produces a spectral content that has non-uniform spikes, the spikes with the highest energy levels may prevent the transmitter from achieving a spectral mask required by regulatory agencies. Accordingly, a set of PSNs may be chosen that cancels particular spectral content while providing generally consistent spike levels as IM products. This assures that whichever spike has the highest energy level, its effect will be substantially mitigated.

Figure 9:
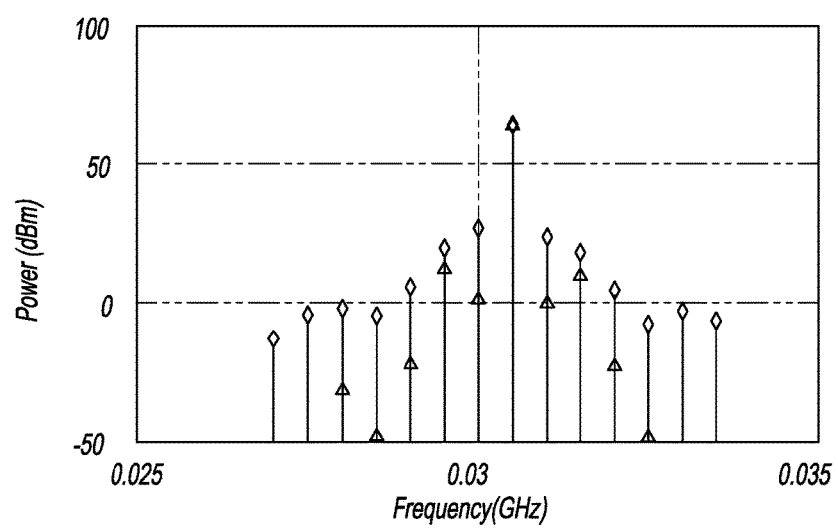
FIG. 9 is a representative power spectrum of an output signal including reverse intermodulation products for a single interference signal as produced by the divider/combiner assembly of FIG. 6 with and without phase shifts.

As an example, FIG. 9 shows the simulated response of divider/combiner assembly 110 having divider and combiner networks with PSNs having phase shifts selected to specifically mitigate the upper IM9 (5fa-4fb) and lower IM7 (4fb-3fa) spectral products for a primary tone at 30.5 MHz and one interference tone at 30.0 MHz. As in previous examples, the transmitter with unmitigated divider/combiner assembly response is represented by the diamond symbols at the tops of the spectral lines or spikes. The triangles on the spectral lines indicate the levels of energy transmitted by a transmitter having divider/combiner assembly 110 with the following phase-shift properties. In this example, divider phase-shift circuit 128-1 and combiner phase-shift circuit 142-4 produce a relative phase adjustment of 88 degrees. Divider phase-shift circuit 128-2 and combiner phase-shift circuit 142-3 produce a relative phase adjustment of 89 degrees. Divider phase-shift circuit 128-3 and combiner phase-shift circuit 142-2 produce a relative phase adjustment of 45 degrees. Divider phase-shift circuit 128-4 and combiner phase-shift circuit 142-1 produce a relative phase adjustment of 48 degrees. As can be seen in FIG. 9, the upper IM9 and lower IM7 spectral products are deeply mitigated, while other IM products are left unaltered or less mitigated. Compared to FIG. 9, the spectral response of divider/combiner 110 configured to produce the response shown in FIG. 7 provides more consistent attenuation of or reduction in the various IM products.

Figure 10:
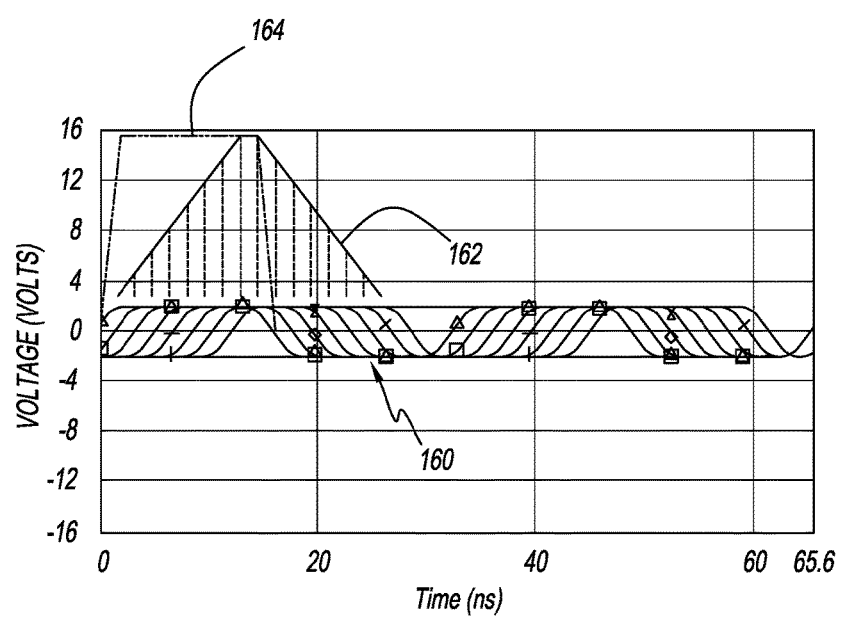
FIG. 10 is an exemplary representation of phase-shifted time-domain signals conducted by amplifiers of an 8-way divider/combiner assembly and combined signal amplitude envelope.

FIG. 10 shows typical time-domain signals 160 of an eight-way divider/combiner assembly, with three binary stages or other number of stages with one or more non-binary N-way stages, such as a single eight-way stage or a two-way (binary) stage and a 4-way stage, producing 8 signal lines that are input to and output from the amplifiers. Each amplifier may have one amplifying transistor or more than one amplifying transistor. Time domain signals 160 thus include 8 signals having different phases. Where the amplifiers include two or more transistors, the transistors in each amplifier may conduct signals having the same phase. As can be seen, the signal waveforms are staggered in the time axis, instead of being superimposed on top of each other as in the case of an in-phase divider/combiner assembly. In this example, the eight signal phases are ideally 22.5 degrees apart at the amplifiers.

The energy load 162 during a positive-voltage half cycle for a power supply supplying the phase-distributed signals is simplistically illustrated by the generally triangular waveform having solid lines. The vertical dashed lines indicate the general timing of the addition or subtraction of an amplifier signal from the collection of phase-distributed signals being conducted. The energy load 164 during the positive-voltage half cycle for the eight amplifiers all conducting in-phase signals is illustrated by the dash-dot line. It is seen that the phase-distributed signals require a significantly lower average energy load during a longer period of supplying power than the in-phase signals.

It is seen that the staggering of the signals in the time axis distributes in time instantaneous demands on the power supply supplying the amplifier power compared with an in-phase divider/combiner assembly in which the amplifiers conduct in-phase signals concurrently. In the example of a 16-way divider/combiner assembly having dividers and combiners as shown in FIG. 6 but in an in-phase scenario (no phase-shift circuits), all 16 transistors would demand energy from the power supply at the same time, causing issues such as high current/voltage overshoots or undershoots. In turn, an in-phase combining system would require a more robust power supply design and/or more expensive power supply's components. However, the phase-distributed signals spread out the energy demand throughout the signal cycle, thereby spreading out the energy load and reducing the energy load over most of the signal cycle. The reduced loads may increase the mean-time-between-failures (MTBF) and reduce the cost of the power supply components. The power supply is often one of the top sub-assemblies to fail within many electronic systems.

FIG. 11 is a table listing objective or idealized phase shifts of amplifier signals for various N-way divider/combiner assemblies. The column headings indicate the number N of amplifier signals in the divider/combiner assembly. The second row is the objective phase increment $\Delta\phi_L$ between amplifier signals in order to achieve a relatively even distribution of the phases of the signals. The remaining rows list the objective values of the phase shifts $\Delta\phi_n$, for n=1, 2, ... N−1, for each of the N amplifier signals other than the base signal, which has not had a phase adjustment. That is, the base signal is in phase with the divider/combiner assembly input signal, and has a corresponding phase of 0-degrees.

As an example, 16-way divider/combiner assembly 110 as illustrated in FIG. 6 has a base amplifier signal with zero degrees phase shift, a first amplifier signal with a phase shift $\Delta\phi_1$=11.25 degrees, a second amplifier signal with a phase shift $\Delta\phi_2$=22.5 degrees, a third amplifier signal with a phase shift $\Delta\phi_3$=33.75 degrees, and so on up to a fifteenth amplifier signal with a phase shift $\Delta\phi_{15}$=168.75 degrees. Other examples are also shown for N=2-9. Phase shifts for other values of N are determined by setting $\Delta\phi_L$=180/N.

Figure 12:
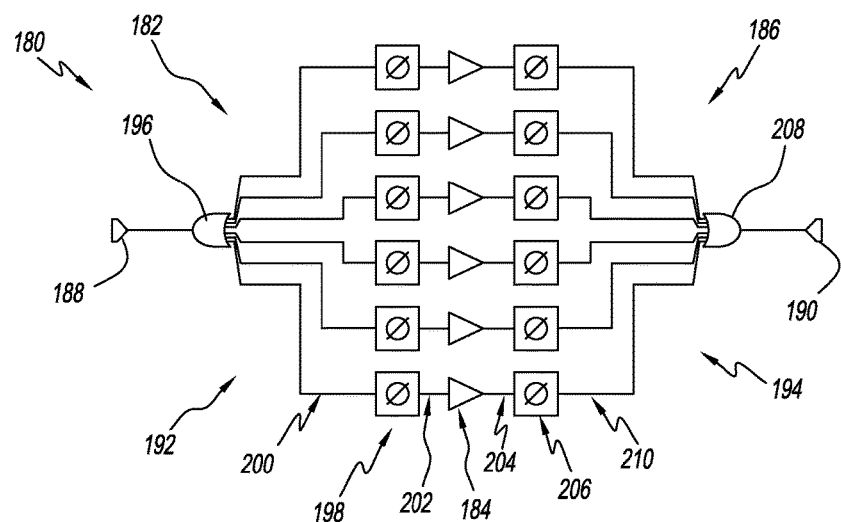
FIG. 12 is an exemplary schematic diagram of a single-stage six-way divider/combiner assembly with phase shift.

Other configurations of divider/combiner assemblies may also be used to provide IM product mitigation. For example, an N-way divider/combiner assembly, where N>2, i.e., a non-binary configuration, may be used with dividers and combiners providing resistive isolation among the N signal lines. FIG. 12 is an exemplary schematic diagram of a single-stage N-way divider/combiner assembly 180 with phase shift, where N=6.

Power divider/combiner assembly 180 includes a divider network 182, an array of N=6 amplifiers 184, and a combiner network 186. Divider network 182 receives an input signal on an input 188, and combiner network 186 outputs an output signal on an output 190. Input 188 is a divider/combiner-assembly input as well as a divider network input.

Divider network 182 includes a single six-way divider network stage 192 that divides the signal into six divider output signals that are input into respective amplifiers 184 in the amplifier array. Combiner network 186 includes a corresponding single six-way combiner network stage 194 that combines the six amplified signals output from the array of amplifiers 184 to form the output signal on output 190.

The divider network stage 192 includes a single six-way divider 196 and six associated divider phase-shift circuits 198. Divider 196 divides an input signal received on input 188, which is also referred to as a divider input, and produces six equal divider output signals on respective divider output signal lines 200, which are also referred to as associated divider outputs.

Divider phase-shift circuits 198 may shift the phases of the divider output signals on divider outputs 200 to produce phase-adjusted signals on divider phase-shift output signal lines 202. The divider output signal lines may also be referred to as divider phase-shift circuit outputs. In some examples, one of the phase-shift circuits may not vary the phase of the divider output signal. The phase shifts are preferably selected so that the signal on each divider phase-shift output has a different phase. Each divider phase-shift circuit 198 correspondingly in effect shifts the phase of the divider output signal on one of the divider outputs relative to the phases of the divider output signals on the other divider phase-shift circuit outputs. Divider network stage 192 thus divides a single input into six phase-shift circuit outputs having different phases.

In this embodiment, there are six amplifiers 184, there being one amplifier for each divider network output 200. Amplifiers 184 may be any amplifier suitable for a particular application. In a particular embodiment, lateral double-diffused MOSFET (LDMOS) transistors are used. Each amplifier amplifies a signal received on a respective divider phase-shift circuit output 202, which is also thereby an amplifier input. Each amplifier produces an amplified signal on an amplifier output 204.

Combiner network 186 provides selective phase shifting and combining of the six amplified signals on amplifier outputs 204. Combiner network 186 includes six combiner phase-shift circuits 206 and a six-way combiner 208. In general, each combiner phase-shift circuit 206 of combiner network 186 shifts the phase of an input signal on a respective amplifier output 204, which in this example also serves as a combiner phase-shift circuit input. Each combiner phase-shift circuit 206 outputs a phase-shifted signal on a respective combiner phase-shift circuit output 210. Combiner phase-shift circuit outputs 210 are combiner inputs for combiner 208. Combiner 208 combines the signals on the six combiner inputs and produces a combiner output signal on divider/combiner assembly output 190, which is also a combiner network output and a combiner output.

In an embodiment of divider/combiner assembly 180, the phase-shift circuits or networks (PSNs) provide a different phase adjustment at each of the divider phase-shift circuits 198 and at each of the combiner phase-shift circuits 206. In this example, respective phase shifts of 27, 63, 89, 117, 153, and 177 degrees are applied. A divided signal that is phase shifted by 27 degrees by a divider phase-shift circuit 198 is then further phase shifted by 177 degrees by the corresponding combiner phase-shift circuit 206. A divided signal that is phase shifted by 63 degrees by a divider phase-shift circuit 198 is then further phase shifted by 153 degrees by the corresponding combiner phase-shift circuit 206. A divided signal that is phase shifted by 89 degrees by a divider phase-shift circuit 198 is then further phase shifted by 117 degrees by the corresponding combiner phase-shift circuit 206. A divided signal that is phase shifted by 117 degrees by a divider phase-shift circuit 198 is then further phase shifted by 89 degrees by the corresponding combiner phase-shift circuit 206. A divided signal that is phase shifted by 153 degrees by a divider phase-shift circuit 198 is then further phase shifted by 63 degrees by the corresponding combiner phase-shift circuit 206. A divided signal that is phase shifted by 177 degrees by a divider phase-shift circuit 198 is then further phase shifted by 27 degrees by the corresponding combiner phase-shift circuit 206.

This results in two of the divided signals being phase shifted by 177 degrees+27 degrees=204 degrees, another two of the divided signals being phase shifted by 153 degrees+63 degrees=216 degrees, and the remaining two of the divided signals being phase shifted by 117 degrees+89 degrees=206 degrees. These phase shift totals are sufficiently close to provide relatively coherent recombining of the signals by combiner 208 to form the output signal on output 190 of divider/combiner assembly 180. These values provide mitigation of reverse IM products across the frequency spectrum. So long as the phase-shift values at each phase-shift circuit are within a threshold of 5 degrees of the nominal, idealized values for a six-way divider/combiner assembly, examples of which are shown in FIG. 11, the signals combine sufficiently coherently.

The values of the PSNs were determined by an optimization algorithm based upon the specific non-linear characteristics of the LDMOS transistor used in this amplifier design. With a different transistor, be it a different brand or a different layout, the values of the PSNs may be different to accommodate differences in parameter variations and behavior as functions of power drive level, frequency, number and nature of interference tones, and mitigation objective.

In this example, the phase shifts are selected to produce favorable reverse IM product mitigation. It will also be seen that the phase shift of 27 degrees is less than two thirds of the next higher phase shift of 63 degrees. None of the phase shifts of 27, 63, 89, 117, 153, and 177 degrees divides evenly into 360 degrees. Also, none of the lower phase shifts of 27, 63, 89, 117, and 153 degrees divides evenly into the next higher phase shifts of 63, 89, 117, 153, and 177 degrees, respectively. The phase shift of 27 degrees is less than 45 degrees. The phase shift of 27 degrees is between 30 degrees and 16 degrees. None of the phase shifts is equal to an integral multiple of $\Delta\phi_L=180°/N$, which in this example is 30 degrees.

In some examples, the first or lowest phase shift is preferably $\Delta\phi 1=180°/N+/-30\%$ or about 21 degrees to 39 degrees for N=6. The second phase shift is preferably $\Delta\phi_2=2(180°/N)+/-30\%$ or about 42 degrees to 78 degrees for N=6. The third phase shift is preferably $\Delta\phi_3=3(180°/N)+/-30\%$ or about 63 degrees to 117 degrees for N=6. The fourth phase shift is preferably $\Delta\phi_4=4(180°/N)+/-30\%$ or about 84 degrees to 156 degrees for N=6. In general terms, the n-th phase shift at the amplifiers is preferably $\Delta\phi n=(n)(180°/N)+/-30\%$ for integer n, where $1<n\leq N$ for a single stage N-way divider/combiner assembly. In further examples, the phase shift is in the range $(0.7)n\Delta\phi_L \leq \Delta\phi_n \leq (0.95)n\Delta\phi_L$ or in the range $(1.05)n\Delta\phi_L \leq \Delta\phi_n \leq ((1.3)n\Delta\phi_L$, where $\Delta\phi_L=180°/N$ and n is a positive integer less than or equal to N. In some examples, $\Delta\phi n\leq(0.9)n\Delta\phi_L$ or $\Delta\phi_n\leq(1.1)n\Delta\phi_L$.

Figure 13:
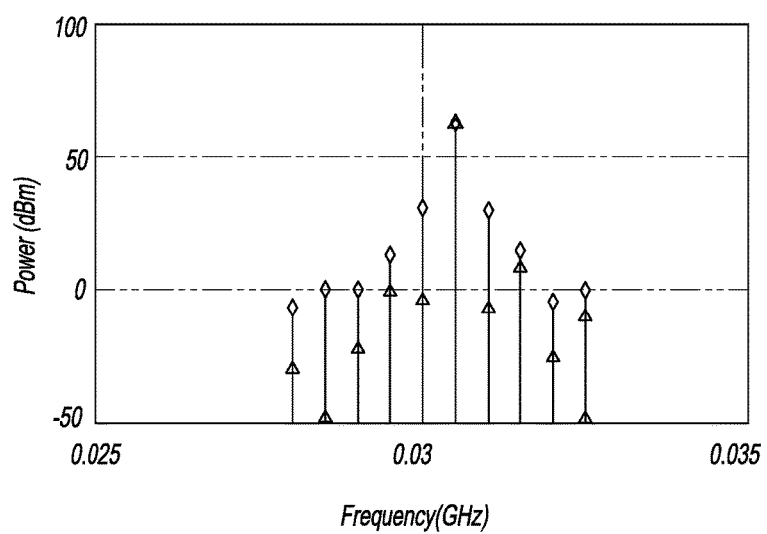
FIG. 13 is a representative power spectrum of a transmission signal including reverse intermodulation products for a single interference signal as produced by the divider/combiner assembly of FIG. 12 with and without phase shifts.

FIG. 13 is a representative simulated power spectrum of a transmitter including reverse intermodulation products for a single interference signal as produced by a single-stage six-way divider/combiner assembly with and without phase shifts. This power spectrum is for a primary tone at 30.5 MHz and one interference tone at 30.0 MHz. The transmitter with unmitigated (without phase shift) divider/combiner assembly response is represented by the diamond symbols at the tops of spectral lines or spikes. The triangles on the spectral lines indicate the levels of energy transmitted by a transmitter having divider/combiner assembly 180 as shown in FIG. 12. As shown in FIG. 13, divider/combiner assembly 180 having a single stage six-way divider and a single stage six-way combiner also provides mitigation of reverse IM products across the frequency spectrum and no mitigation of the primary signal.

Figure 14:
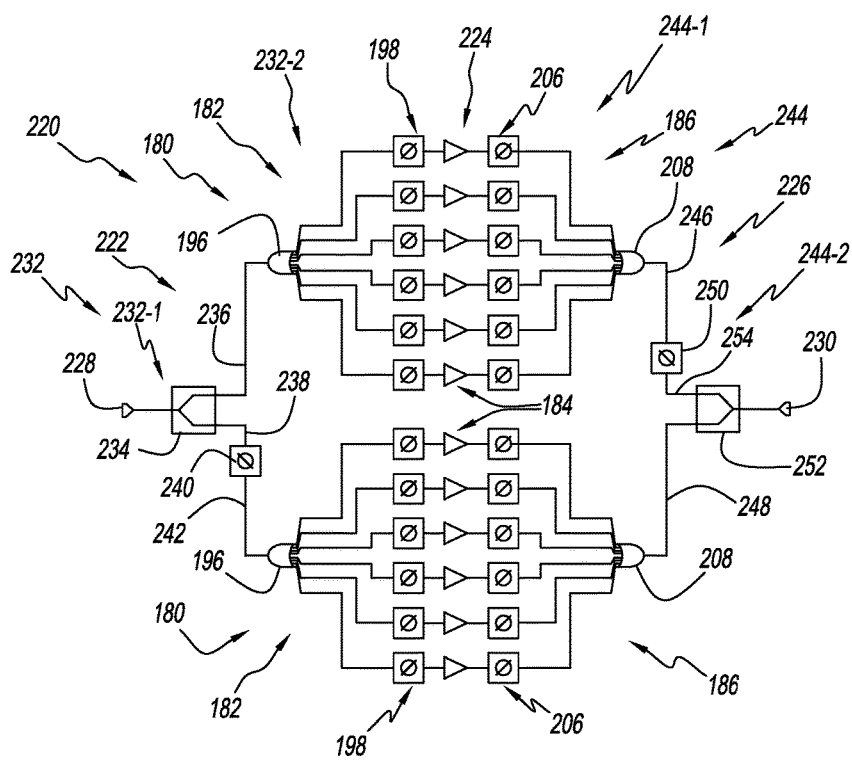
FIG. 14 is an exemplary schematic diagram of a two-stage, combination two-way/six-way divider/combiner assembly with phase shift.

FIG. 14 is an exemplary schematic diagram of a two-stage, combination two-way/six-way divider/combiner assembly 220 with phase shift, for N=12. Power divider/combiner assembly 220 includes a divider network 222, an array of N=12 amplifiers 224, and a combiner network 226. Divider network 222 receives an input signal on an input 228. Input 228 is a divider/combiner-assembly input as well as a divider network input. Combiner network 226 outputs an output signal on an output 230.

Divider network 222 has two divider network stages 232, including a first two-way divider network stage 232-1 that includes a two-way divider 234 that divides the signal on input 228 into two divider output signals on divider outputs 236, 238. Divider output 236 is also an input into a first divider/combiner assembly 180 as described above. Divider output 238 is also a divider phase-shift circuit input to a divider phase-shift circuit 240. An output 242 of divider phase-shift circuit 240 is also an input into a second divider/combiner assembly 180. Divider network 222 thus also includes a second divider network stage 232-2 that includes two six-way divider networks 182 with respective six-way dividers 196 and divider phase-shift circuits 198.

The outputs from divider phase-shift circuits 198 are input into respective amplifiers 224. The two arrays of six amplifiers 184 form the array of 12 amplifiers 224 of divider/combiner assembly 220.

Combiner network 226 includes two combiner network stages 244. First combiner network stage 244-1 is formed by two combiner networks 186 of the two divider/combiner assemblies 180. Each combiner network 186 includes six respective combiner phase-shift circuits 206 and a six-way combiner 208, and phase-shifts and combines six respective amplified signals output from the respective array of amplifiers 184 into output signals on respective combiner outputs 246, 248.

A second combiner network stage 244-2 includes a combiner phase-shift circuit 250 and a two-way combiner 252. Combiner output 246 is a combiner phase-shift circuit input for combiner phase-shift circuit 250. Combiner phase-shift circuit 250 applies a phase shift to the combiner phase-shift circuit input signal and outputs a phase-shifted signal on a combiner phase-shift circuit output 254. Combiner phase-shift circuit output 254 is a combiner input to combiner 252 along with first-stage combiner output 248. Combiner 252 combines the two input signals on combiner inputs 248, 254, and outputs the combined signal on divider/combiner assembly output 230, which is also the combiner network output and the combiner output.

Divider phase-shift circuits 198, 240 may shift the phases of the signals input to the divider phase-shift circuits to produce in combination amplifier input signals having different phases. Divider network 222 thus divides a single input into twelve phase-shift circuit outputs having different phases. In some embodiments, the phase differences provide a broad distribution of phases over a wavelength of the primary signal frequency.

In an example, the stage 232-1 signal output on divider output 236 is not phase adjusted relative to the divider/combiner assembly signal received on input 228. Divider phase-shift circuit 240 applies a phase adjustment of 93 degrees to the divider/combiner assembly signal received on input 228, and thereby to the signal on divider output 238. Each six-way divider network 182 applies phase shifts of 27, 63, 89, 117, 153, and 177 degrees to the divider. This results in twelve signals being input into the twelve amplifiers 224 having phases of 27, 63, 89, 117, 120, 153, 156, 177, 182, 210, 246, and 270 degrees. It will be appreciated that this broad distribution of phase angles provides broad spectrum IM product mitigation while producing low levels of signal-peak concurrence between the amplifiers and distributed energy consumption over a majority of a signal wavelength.

Combiner network 226 provides selective phase shifting and combining of the 12 amplified signals received on the amplifier outputs. Combiner phase-shift circuits 206 adjust the phases in the reverse order of the phase adjustments applied by the divider phase-shift circuits 198. Similarly, combiner phase-shift circuit 250 applies a phase adjustment of 93 degrees to the signal lines for which no phase adjustment was applied in divider stage 232-1. This results in combiner 252 outputting signals having phases adjusted 93 degrees more than the phases of the signals output from combiner 208 of divider/combiner assembly 180. The signals combined thus have phases of 297 degrees, 299 degrees, and 309 degrees, which are all sufficiently in phase or coherent for maintaining the main signal at desired levels. Phase-shift values at each phase-shift circuit are preferably within a threshold of 3 degrees of the nominal, idealized values for a 12-way divider/combiner assembly, for producing substantially coherent or in-phase signals when recombined.

Figure 15:
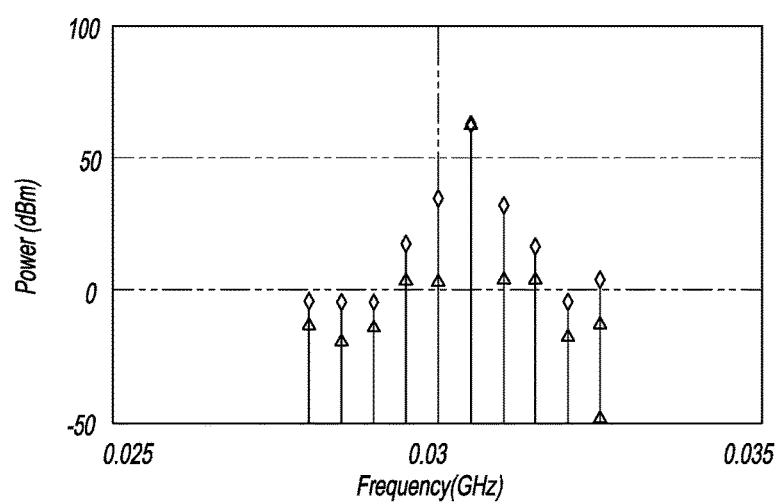
FIG. 15 is a representative power spectrum of a transmission signal including reverse intermodulation products for a single interference signal as produced by the divider/combiner assembly of FIG. 14 with and without phase shifts.

FIG. 15 is a representative power spectrum of a transmission signal including reverse intermodulation products for a single interference signal as produced by divider/combiner assembly 220 of FIG. 14 with and without phase shifts. This power spectrum is for a primary tone at 30.5 MHz and one interference tone at 30.0 MHz. The transmitter with unmitigated (in-phase) divider/combiner assembly response is represented by the diamond symbols at the tops of the spectral lines or spikes. The triangles on the spectral lines indicate the levels of energy transmitted by a transmitter having divider/combiner assembly 220 with phase adjustments as described above. It is seen that the IM products across the frequency spectrum and interference signal are mitigated and the primary signal is unmitigated.

Figure 16:
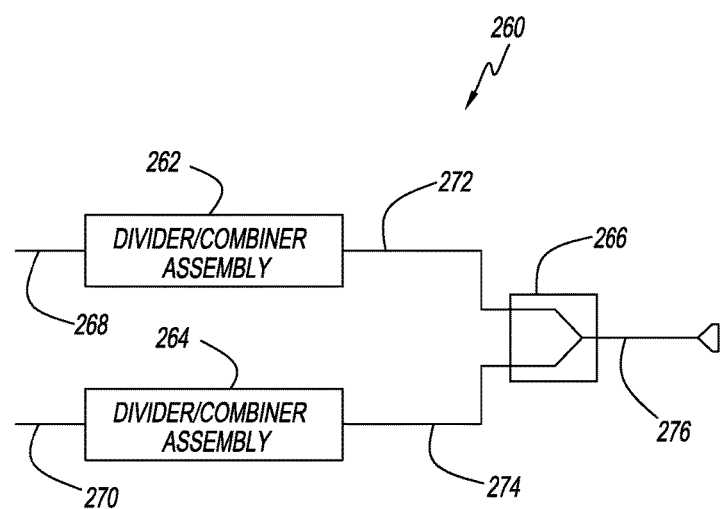
FIG. 16 is a general schematic diagram of a non-coherent combiner assembly incorporating divider/combiner assemblies of FIG. 6 for each of two non-coherent signals.

Even though single and plural stage N-way divider/combiner assemblies are shown, for N≥2, other configurations having a divider/combiner assembly may be used. Besides the benefits associated with the relatively coherent schemes, yet another embodiment is the employment of IM product mitigating divider/combiner assemblies in non-coherent systems. FIG. 16 is a general schematic diagram of an example of a non-coherent combiner system 260 incorporating phase-shifting divider/combiner assemblies 262, 264, and system combiner 266. Divider/combiner assemblies 262, 264 function as power amplifiers and may be any suitable configuration as described above, such as a divider/combiner assembly 110 of FIG. 6.

A first input signal is input on a first input signal line 268, and a second input signal is input on a second input signal line 270. The first and second input signals are non-coherent in the sense that they may have different phases and may have different frequencies. In a typical application, the first and second input signals are received from independent sources and have different frequencies.

The two input signals are input to respective divider/combiner assemblies 262, 264 that each mitigate IM products received on the outputs of the divider/combiner assemblies. Divider/combiner assemblies 262, 264 produce output signals on respective signal lines 272, 274. Signal lines 268, 270 are also referred to as system combiner inputs. The signals on signal lines 272, 274 are input to two-way combiner 266. The combiner combines the two signals and outputs them on signal line 276, which is the system combiner output as well as the output for combiner system 260. This output is then fed to the antenna of the associated transmitter.

Combiner system 260 includes a two-way or binary system combiner 266. It will be understood that combiner system 260 may include one or a combination of N-way combiners, where N≥2, appropriate for the number of input signals and may include one or more stages.

In combiner system 260 shown in FIG. 16, two independent signal sources are combined via combiner 266 and the summed energy is output to an antenna. In such a non-coherent combining topology, especially when reflection of the output at the antenna is taken into consideration, reverse IM products created from the non-coherent tones, reflecting back from the antenna, act as interference signals to one another.

Figure 17:
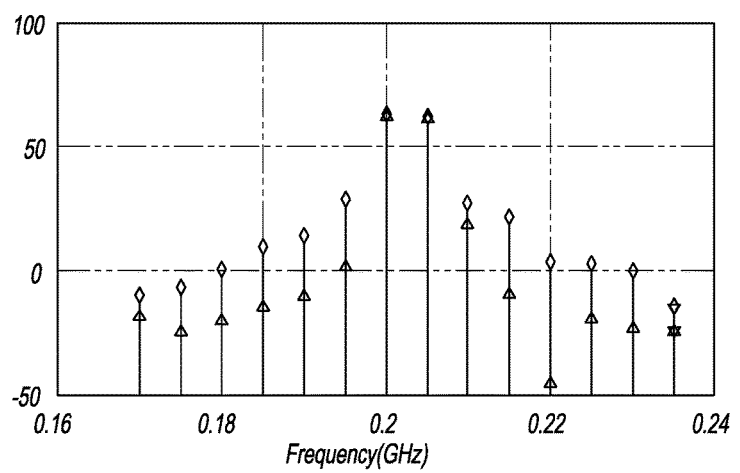
FIG. 17 is a representative power spectrum of a transmission signal including reverse intermodulation products for two non-coherent signals as produced by the divider/combiner assembly of FIG. 16 with and without phase shifts.

FIG. 17 is a representative power spectrum of a simulation of a transmission signal including reverse intermodulation products for two non-coherent signals as produced by combiner system 260 of FIG. 16 with and without phase shifts. The two non-coherent primary signals in this example have frequencies of 200 MHz and 205 MHz. In this configuration, the two primary signals produce IM products approximately every 5 MHz from the two primary signal frequencies, as shown. The power spectrum for a transmitter with unmitigated divider/combiner assembly response is represented by the diamond symbols at the tops of the spectral lines or spikes. The triangles on the spectral lines indicate the levels of energy transmitted by a transmitter having combiner system 260 with divider/combiner assemblies 262, 264 configured as divider/combiner assembly 110 illustrated in FIG. 6. It is seen that non-coherent combiner system 260 mitigates the generated reverse IM products.

Even though the simulation results thus far are shown at specific HF and VHF frequencies, IM product mitigating divider/combiner assemblies may be designed for use at other frequency ranges, including UHF, cellular, S-band, C-band, X-band, Ku and Ka-band, as well as millimeter-wave bands and beyond. The phase-shift networks or circuits are designed for the particular frequency band of the intended application, and then the configuration of suitable N-way dividers and combiners are designed to provide relatively coherent or in-phase combining of signals to produce an output signal for each IM product mitigating divider/combiner assembly.

Further, the various PSNs can be made to operate at various impedances in addition to the common 50-ohm value so as to improve the bandwidth of operation, to increase the power-handling capability, to enhance the ease of construction of the PSN circuits, to reduce the size of the circuit enclosure, and/or for impedance matching to achieve low insertion loss. The characteristic impedance of a transmission line, be it in a lumped or distributed form, is directly proportional to the square root of the ratio of L/C, where L is the equivalent lumped inductance (or per unit length) and C is the equivalent lumped capacitance (or per unit length). A higher or lower operating impedance at a junction can affect the ease of implementation or the final performance. The judicious choice of operating impedance at a particular junction provides another degree-of-freedom to the designer designing an IM product mitigating system.

The described embodiments of IM product mitigating divider/combiner assemblies are passive, other than the amplifiers, may be deployed as a primary device for mitigating reverse IM products, and may be used in conjunction with active reverse IM product mitigation schemes. Accordingly, divider/combiner assemblies may be made with amplifiers having semiconductor transistors as well as vacuum tube devices.

Designed divider/combiner assemblies may be tested and modified as needed inside a controlled-environment such as a laboratory prior to deployment in the fields. This can result in savings in terms of time and financial budget, and improved accuracy of measured data.

A design may be simulated by implementing a circuit description including an appropriate non-linear transistor computer model utilized in an optimization process to generate values of the PSNs for a particular combining need. Such an optimizable circuit description may be based on an ideal feed-forward loop in which the main tone is cancelled from a portion of its image. The resulting spectral content, which includes primarily undesirable components, may then be minimized by means of common optimization routines available to most simulation software packages. Such an ideal feed-forward loop is not realizable in practice, but is very useful and accurate in a computerized setting, especially with the use of increasingly accurate non-linear models of the transistors.

For example, a test setup may include attaching a 30-dB coupler to the output of the power combined amplifier-under-test (AUT), which is the divider/combiner assembly in this case. The 30-dB coupler injects appropriate interference tones back to the output of the transistors to induce the generation of reverse IM products. The main output of the AUT feeds through to the main line of the 30-dB coupler, where the spectral cleanliness can be monitored by means of a spectrum analyzer, with use of an attenuator if appropriate. Such a test setup can be used to test, optimize, and modify a divider/combiner assembly to suit a particular requirement, within the convenience and accuracy of a laboratory. This avoids the need to test a design in the field where the sources of interferences are numerous, intermittent, and sometimes not representative of the real situation in which the system is intended to be deployed.

In summary, the disclosed divider/combiner assembly can be designed to address both the general requirement to cancel the overall IM product content as much as possible, as well as the specific requirement to reduce as much as possible specific IM products. The divider/combiner assembly can be used to reduce reverse IM products of relatively coherent and non-coherent combining architectures, for both binary (two-way) and other N-way configurations, over multi-octave bandwidths with the capacity to conduct energy at kilowatt power levels. The phase angles provided by the PSNs can be custom tailored to combat specific IM products. The phase distribution of signals at the amplifiers spreads the power required from the power supply over time, reducing the stress on the power supply, increasing its mean time between failures (MTBF), and/or relaxing the robustness requirement of the power supply's discrete components.

IM product mitigating divider/combiner assemblies provide IM product mitigation at each phase-shift stage. These phase-shifting stages contribute to the mitigation of IM products, which along with the electrical benefits there is a thermal benefit as well. Also, the values of the phase shifts may be chosen to counter-act unequal delays associated with asymmetric feed points at the drains of the transistors. For example, in a two-stage or three-way or four-way divider/combiner assembly, phase shifts provided by the PSNs may have the values of 82° and 38°. In another example, a three-stage eight-way binary divider/combiner assembly may include 84°, 52° and 20° phase shifts. As discussed above with reference to divider/combiner assembly 110 illustrated in FIG. 6, a four-stage 16-way binary combiner may include phase shifts of 86°, 50°, 23°, and 9°. The phase-shift values are determined based on the type of semiconductor transistor or other active device, the specific layout of such active device, and the layout of the divider/combiner assembly itself. This way, each PSN mitigates a specific set of IM products and the combination of PSNs mitigate the IM products in a distributed manner. This increases the amount of mitigation of IM products overall and spreads the thermal energy buildup and thereby, the thermal energy dissipation throughout the chassis supporting the divider/combiner assembly.

Also, the more stages in a divider/combiner assembly and the resulting increase in amplifier signal lines there are in the divider/combiner assembly, the smaller the peripheries of the constituent transistors and the feed lines can be made more symmetric. This can result in lower energy levels for IM products and improved overall IM product mitigation. Furthermore, the use of more stages and distributed phase angles in the amplifier signals produce time-domain signals at the drains of the transistors that are staggered in time. Since the peaks of the distributed signal waveforms do not coincide, there is substantially reduced concurrent operation of transistors undergoing nonlinear operation. This also reduces the instantaneous IM product magnitude.

The following paragraphs describe aspects and features of combiner systems and divider/combiner assemblies as described above, and are alphanumerically designated for clarity and efficiency. Each of these paragraphs can be combined with one or more other paragraphs, and/or with disclosure from elsewhere in this application in any suitable manner. Some of the paragraphs below expressly refer to and further limit other paragraphs, providing without limitation examples of some of the suitable combinations.

A1. A power divider/combiner assembly comprising a divider network for dividing a received divider-network input signal into N divider-network output signals, where N is an integer greater than seven, the divider network including at least one divider and at least one of each of first, second, and third divider phase-shift circuits, each divider having a divider input and a plurality of divider outputs and being configured to divide a divider input signal on the divider input into a divider output signal on each of the plurality of divider outputs, each divider phase-shift circuit being configured to produce a respective non-zero phase shift between divider output signals on an associated pair of divider outputs of an associated divider of the at least one divider, each first divider phase-shift circuit producing a first phase shift, each second divider phase-shift circuit producing a second phase shift that is more than the first phase shift, and each third divider phase-shift circuit producing a third phase shift that is more than the second phase shift; N amplifiers, each amplifier amplifying one of the N divider-network output signals into a respective amplified signal; and a combiner network for combining the N amplified signals into a combiner-network output signal, the combiner network including at least one combiner and at least one of each of first, second, and third combiner phase-shift circuits, with each combiner having a plurality of combiner inputs and a combiner output and being configured to combine combiner input signals on the plurality of combiner inputs into a combiner output signal on the combiner output, each combiner phase-shift circuit being configured to produce a respective non-zero phase shift between combiner input signals on an associated pair of combiner inputs of an associated combiner of the at least one combiner, each first combiner phase-shift circuit producing the first phase shift, each second combiner phase-shift circuit producing the second phase shift, and each third combiner phase-shift circuit producing the third phase shift.

A2. The power divider/combiner assembly of paragraph A1, wherein the first phase shift is less than two thirds of the second phase shift, and the second phase shift is less than two thirds of the third phase shift.

A3. The power divider/combiner assembly of paragraph A1, wherein at least one of the first, second, and third phase shifts does not divide evenly into 360 degrees.

A4. The power divider/combiner assembly of paragraph A1, wherein the first phase shift does not divide evenly into the second phase shift.

A5. The power divider/combiner assembly of paragraph A1, wherein at least one of the first, second, and third phase shifts is less than 45 degrees.

A6. The power divider/combiner assembly of paragraph A1, wherein the first phase shift is between 16 degrees and 30 degrees.

A7. The power divider/combiner assembly of paragraph A1, wherein two of the first, second, and third divider phase-shift circuits are configured to produce respective non-zero phase shifts between divider output signals on divider outputs of the same divider.

A8. The power divider/combiner assembly of paragraph A1, wherein a first divider of the at least one divider is associated with one of each of the first, second, and third divider phase-shift circuits.

A9. The power divider/combiner assembly of paragraph A1, wherein two of the first, second, and third combiner phase-shift circuits are configured to produce respective non-zero phase shifts between combiner input signals on combiner inputs of the same combiner.

A10. The power divider/combiner assembly of paragraph A1, wherein a first combiner of the at least one combiner is associated with one of each of the first, second, and third combiner phase-shift circuits.

A11. The power divider/combiner assembly of paragraph A1, wherein the at least one divider includes at least three dividers that are each associated with a different one of the first, second, and third divider phase-shift circuits.

A12. The power divider/combiner assembly of paragraph A1, wherein the at least one combiner includes at least three combiners that are each associated with a different one of the first, second, and third combiner phase-shift circuits.

A13. The power divider/combiner assembly of paragraph A1, further comprising at least one fourth divider phase-shift circuit with each fourth divider phase-shift circuit being configured to produce a non-zero fourth phase shift between divider output signals on an associated pair of divider outputs of an associated divider of the at least one divider, the fourth phase shift being more than the third phase shift; and each fourth combiner phase-shift circuit being configured to produce the fourth phase shift between combiner input signals on an associated pair of combiner inputs of an associated combiner of the at least one combiner.

A14. The power divider/combiner assembly of paragraph A13, wherein the first and second phase shifts are below 45 degrees.

A15. The power divider/combiner assembly of paragraph A13, wherein the first phase shift is between 15 degrees and 8 degrees.

A16. The power divider/combiner assembly of paragraph A1, wherein the first phase shift is $\Delta\phi_1=180°/N+/-30\%$, the second phase shift is $\Delta\phi_2=2(180°/N)+/-30\%$, and the third phase shift is $\Delta\phi_3=4(180°/N)+/-30\%$.

A17. A combiner system comprising a first power divider/combiner assembly according to paragraph A1, the first power divider/combiner assembly amplifying a first system input signal; a second power divider/combiner assembly according to paragraph A1, the second power divider/combiner assembly amplifying a second system input signal, the first and second system input signals being non-coherent signals; and a system combiner having first and second system combiner inputs and a system combiner output, and being configured to combine the amplified first system input signal on the first system combiner input and the amplified second system input signal on the second system combiner input into a system combiner output signal on the system combiner output.

B1. A power divider/combiner assembly comprising a divider network for dividing a received divider-network input signal into N divider-network output signals, where N is an integer greater than one, the divider network including at least one divider and at least one divider phase-shift circuit, with each divider having a divider input and a plurality of divider outputs and being configured to divide a divider input signal on the divider input into a divider output signal on each of the plurality of divider outputs; a first divider phase-shift circuit of the at least one divider phase-shift circuit being configured to produce a non-zero first phase shift, $\Delta\phi_1$, between a first divider output signal on a first divider output of the plurality of divider outputs of a first divider of the at least one divider and a second divider output signal on a second divider output of the first divider, where $(0.7)n\Delta\phi_L \leq \Delta\phi_1 \leq (0.95)n\Delta\phi_L$ or $(1.05)n\Delta\phi_L \leq \Delta\phi_1 \leq (1.3)n\Delta\phi_L$, where $\Delta\phi_L=180°/N$ and n is a positive integer; N amplifiers, each amplifier amplifying one of the N divider-network output signals into a respective amplified signal; and a combiner network for combining the N amplified signals into a combiner-network output signal, the combiner network including at least one combiner and at least one combiner phase-shift circuit, with each combiner having a plurality of combiner inputs for conducting a corresponding plurality of respective combiner input signals and a combiner output for conducting a combiner output signal, at least a first combiner phase-shift circuit of the at least one combiner phase-shift circuit being configured to shift the phase by the first phase shift of a first combiner input signal on a first combiner input of a respective combiner relative to a phase of a second combiner input signal on a second combiner input of the respective combiner.

B2. The power divider/combiner assembly of paragraph B1, wherein the divider network includes a plurality of divider phase-shift circuits producing different phase shifts and none of the phase shifts is equal to an integral multiple of $\Delta\phi_L$.

B3. The power divider/combiner assembly of paragraph B1, wherein the combiner network includes a plurality of combiner phase-shift circuits producing different phase shifts and none of the phase shifts is equal to an integral multiple of $\Delta\phi_L$.

B4. The power divider/combiner assembly of paragraph B1, wherein $\Delta\phi_1 \leq (0.9)n\Delta\phi_L$ or $\Delta\phi_1 \geq (1.1)n\Delta\phi_L$.

B5. A combiner system comprising a first power divider/combiner assembly according to paragraph B118, the first power divider/combiner assembly amplifying a first system-input signal; a second power divider/combiner assembly according to paragraph B118, the second power divider/combiner assembly amplifying a second system-input signal, the first and second system-input signals being non-coherent; and a system combiner having first and second system-combiner inputs and a system-combiner output, and being configured to combine the amplified first system-input signal on the first system-combiner input and the amplified second system-input signal on the second system-combiner input into a system-output signal on the system-combiner output.

C1. A power divider/combiner assembly comprising a divider network for dividing a received divider-network input signal into N divider-network output signals, where N is an integer greater than two, the divider network including at least a first divider and at least one of each of at least first and second divider phase-shift circuits, the first divider having a divider input and at least three divider outputs and being configured to divide a divider input signal on the divider input into a divider output signal on each of the at least three divider outputs, one of the first divider phase-shift circuits being configured to produce a non-zero first phase shift between divider output signals on first and second divider outputs of the first divider, and one of the second divider phase-shift circuits being configured to produce a second phase shift between the divider output signal on the first divider output and a divider output signal on a third divider output of the first divider, the second phase-shift being more than the first phase shift; N amplifiers, each amplifier amplifying one of the N divider-network output signals into a respective amplified signal; and a combiner network for combining the N amplified signals into a combiner-network output signal, the combiner network including at least a first combiner and at least one of each of at least first and second combiner phase-shift circuits, the first combiner having at least three combiner inputs and a combiner output and being configured to combine combiner input signals on the at least three combiner inputs into a combiner output signal on the combiner output, one of the first phase-shift circuits being configured to produce the first phase shift between combiner input signals on first and second combiner inputs of the first combiner, and one of the second phase-shift circuits being configured to produce the second phase shift between the combiner input signal on the first combiner input and a combiner input signal on a third combiner input.

C2. The power divider/combiner assembly of paragraph C1, wherein at least one of the first and second phase shifts does not divide evenly into 360 degrees.

C3. The power divider/combiner assembly of paragraph C1, wherein the second phase shift does not divide evenly into the first phase shift.

C4. The power divider/combiner assembly of paragraph C1, wherein the first phase shift is less than 45 degrees.

C5. The power divider/combiner assembly of paragraph C4, wherein the first phase shift is between 16 degrees and 30 degrees.

C6. The power divider/combiner assembly of paragraph C1, wherein N is greater than three, the divider network further including a third divider phase-shift circuit configured to produce a third phase shift between the divider output signal on the first divider output and a divider output signal on a fourth divider output of the first divider, the third phase-shift being more than the second phase shift, and the combiner network further including a third combiner phase-shift circuit configured to produce the third phase shift between the combiner input signal on the first combiner input and a combiner input signal on a fourth combiner input of the first combiner.

C7. The power divider/combiner assembly of paragraph C6, wherein the first phase shift is $\Delta\phi_1=180°/N+/-30\%$, the second phase shift is $\Delta\phi_2=2(180°/N)+/-30\%$, and the third phase shift is $\Delta\phi_3=4(180°/N)+/-30\%$.

C8. The power divider/combiner assembly of paragraph C6, wherein N is greater than four, the divider network further including a fourth divider phase-shift circuit configured to produce a fourth phase shift between the divider output signal on the first divider output and a divider output signal on a fifth divider output of the first divider, the fourth phase-shift being more than the third phase shift, and the combiner network further including a fourth combiner phase-shift circuit configured to produce the fourth phase shift between the combiner input signal on the first combiner input and a combiner input signal on a fifth combiner input of the first combiner.

C9. The power divider/combiner assembly of paragraph C8, wherein the first and second phase shifts are below 45 degrees.

C10. The power divider/combiner assembly of paragraph C8, wherein the first phase shift is between 8 degrees and 15 degrees.

C11. The power divider/combiner assembly of paragraph C8, wherein the first phase shift is $\Delta\phi_1=180°/N+/-30\%$, the second phase shift is $\Delta\phi_2=2(180°/N)+/-30\%$, the third phase shift is $\Delta\phi_3=3(180°/N)+/-30\%$, and the fourth phase shift is $\Delta\phi_4=4(180°/N)+/-30\%$.

The above description is intended to be illustrative, and not restrictive. Many other embodiments will be apparent to those of skill in the art upon reviewing the above description. The scope of the inventions should, therefore, be determined with reference to the appended claims, along with the full scope of equivalents to which such claims are entitled. Accordingly, while embodiments of divider/combiner assemblies and combiner systems including divider/combiner assemblies and methods of mitigating IM products output by a transmitter have been particularly shown and described, many variations may be made therein. This disclosure may include one or more independent or interdependent inventions directed to various combinations of features, functions, elements and/or properties, one or more of which may be defined in the following claims. Other combinations and sub-combinations of features, functions, elements and/or properties may be claimed later in this or a related application. Such variations, whether they are directed to different combinations or directed to the same combinations, whether different, broader, narrower or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed.

Where the claims recite "a" or "a first" element or the equivalent thereof, such claims include one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated. Ordinal indicators may be applied to associated elements in the order in which they are introduced in a given context, and the ordinal indicators for such elements may be different in different contexts.

The invention claimed is:

1. A power divider/combiner assembly comprising:
a divider network for dividing a received divider-network input signal into N divider-network output signals, where N is an integer greater than seven, the divider network including at least one divider and at least one of each of first, second, and third divider phase-shift circuits, each divider having a divider input and a plurality of divider outputs and being configured to divide a divider input signal on the divider input into a divider output signal on each of the plurality of divider outputs, each divider phase-shift circuit being configured to produce a respective non-zero phase shift between divider output signals on an associated pair of divider outputs of an associated divider of the at least one divider, each first divider phase-shift circuit producing a first phase shift, each second divider phase-shift circuit producing a second phase shift that is more than the first phase shift, and each third divider phase-shift circuit producing a third phase shift that is more than the second phase shift;
N amplifiers, each amplifier amplifying one of the N divider-network output signals into a respective amplified signal; and
a combiner network for combining the N amplified signals into a combiner-network output signal, the combiner network including at least one combiner and at least one of each of first, second, and third combiner phase-shift circuits, with each combiner having a plurality of combiner inputs and a combiner output and being configured to combine combiner input signals on the plurality of combiner inputs into a combiner output signal on the combiner output, each combiner phase-shift circuit being configured to produce a respective non-zero phase shift between combiner input signals on an associated pair of combiner inputs of an associated combiner of the at least one combiner, each first combiner phase-shift circuit producing the first phase shift, each second combiner phase-shift circuit producing the second phase shift, and each third combiner phase-shift circuit producing the third phase shift.

2. The power divider/combiner assembly of claim 1, wherein the first phase shift is less than two thirds of the second phase shift, and the second phase shift is less than two thirds of the third phase shift.

3. The power divider/combiner assembly of claim 1, wherein at least one of the first, second, and third phase shifts does not divide evenly into 360 degrees.

4. The power divider/combiner assembly of claim 1, wherein the first phase shift does not divide evenly into the second phase shift.

5. The power divider/combiner assembly of claim 1, wherein at least one of the first, second, and third phase shifts is less than 45 degrees.

6. The power divider/combiner assembly of claim 1, wherein the first phase shift is between 16 degrees and 30 degrees.

7. The power divider/combiner assembly of claim 1, wherein two of the first, second, and third divider phase-shift circuits are configured to produce respective non-zero phase shifts between divider output signals on divider outputs of the same divider.

8. The power divider/combiner assembly of claim 1, wherein a first divider of the at least one divider is associated with one of each of the first, second, and third divider phase-shift circuits.

9. The power divider/combiner assembly of claim 1, wherein two of the first, second, and third combiner phase-shift circuits are configured to produce respective non-zero phase shifts between combiner input signals on combiner inputs of the same combiner.

10. The power divider/combiner assembly of claim 1, wherein a first combiner of the at least one combiner is associated with one of each of the first, second, and third combiner phase-shift circuits.

11. The power divider/combiner assembly of claim 1, wherein the at least one divider includes at least three dividers that are each associated with a different one of the first, second, and third divider phase-shift circuits.

12. The power divider/combiner assembly of claim 1, wherein the at least one combiner includes at least three combiners that are each associated with a different one of the first, second, and third combiner phase-shift circuits.

13. The power divider/combiner assembly of claim 1, further comprising at least one fourth divider phase-shift circuit with each fourth divider phase-shift circuit being configured to produce a non-zero fourth phase shift between divider output signals on an associated pair of divider outputs of an associated divider of the at least one divider, the fourth phase shift being more than the third phase shift; and each fourth combiner phase-shift circuit being configured to produce the fourth phase shift between combiner input signals on an associated pair of combiner inputs of an associated combiner of the at least one combiner.

14. The power divider/combiner assembly of claim 13, wherein the first and second phase shifts are below 45 degrees.

15. The power divider/combiner assembly of claim 13, wherein the first phase shift is between 8 degrees and 15 degrees.

16. The power divider/combiner assembly of claim 1, wherein the first phase shift is $\Delta\phi_1=180°/N+/-30\%$, the second phase shift is $\Delta\phi_2=2(180°/N)+/-30\%$, and the third phase shift is $\Delta\phi_3=4(180°/N)+/-30\%$.

17. A combiner system comprising:
a first power divider/combiner assembly according to claim 1, the first power divider/combiner assembly amplifying a first system input signal;
a second power divider/combiner assembly according to claim 1, the second power divider/combiner assembly amplifying a second system input signal, the first and second system input signals being non-coherent signals; and
a system combiner having first and second system combiner inputs and a system combiner output, and being configured to combine the amplified first system input signal on the first system combiner input and the amplified second system input signal on the second system combiner input into a system combiner output signal on the system combiner output.

18. A power divider/combiner assembly comprising:
a divider network for dividing a received divider-network input signal into N divider-network output signals, where N is an integer greater than one, the divider network including at least one divider and at least one divider phase-shift circuit, with each divider having a divider input and a plurality of divider outputs and being configured to divide a divider input signal on the divider input into a divider output signal on each of the plurality of divider outputs;
a first divider phase-shift circuit of the at least one divider phase-shift circuit being configured to produce a non-zero first phase shift, $\Delta\phi_1$, between a first divider output signal on a first divider output of the plurality of divider outputs of a first divider of the at least one divider and a second divider output signal on a second divider output of the first divider, where $(0.7)n\Delta\phi_L \leq \Delta\phi_1 \leq (0.95)n\Delta\phi_L$ or $(1.05)n\Delta\phi_L \leq \Delta\phi_1 \leq (1.3)n\Delta\phi_L$, where $\Delta\phi_L=180°/N$ and n is a positive integer;
N amplifiers, each amplifier amplifying one of the N divider-network output signals into a respective amplified signal; and
a combiner network for combining the N amplified signals into a combiner-network output signal, the combiner network including at least one combiner and at least one combiner phase-shift circuit, with each combiner having a plurality of combiner inputs for conducting a corresponding plurality of respective combiner input signals and a combiner output for conducting a combiner output signal, at least a first combiner phase-shift circuit of the at least one combiner phase-shift circuit being configured to shift the phase by the first phase shift of a first combiner input signal on a first combiner input of a respective combiner relative to a phase of a second combiner input signal on a second combiner input of the respective combiner.

19. The power divider/combiner assembly of claim 18, wherein the divider network includes a plurality of divider phase-shift circuits producing different phase shifts and none of the phase shifts is equal to an integral multiple of $\Delta\phi_L$.

20. The power divider/combiner assembly of claim 18, wherein the combiner network includes a plurality of combiner phase-shift circuits producing different phase shifts and none of the phase shifts is equal to an integral multiple of $\Delta\phi_L$.

21. The power divider/combiner assembly of claim 18, wherein $\Delta\phi_1 \leq (0.9)n\Delta\phi_L$ or $\Delta\phi_1 \geq (1.1)n\Delta\phi_L$.

22. A combiner system comprising:
a first power divider/combiner assembly according to claim 18, the first power divider/combiner assembly amplifying a first system-input signal;
a second power divider/combiner assembly according to claim 18, the second power divider/combiner assembly amplifying a second system-input signal, the first and second system-input signals being non-coherent; and
a system combiner having first and second system-combiner inputs and a system-combiner output, and being configured to combine the amplified first system-input signal on the first system-combiner input and the amplified second system-input signal on the second system-combiner input into a system-output signal on the system-combiner output.

23. A power divider/combiner assembly comprising:
a divider network for dividing a received divider-network input signal into N divider-network output signals, where N is an integer greater than two, the divider network including at least a first divider and at least one of each of at least first and second divider phase-shift circuits, the first divider having a divider input and at least three divider outputs and being configured to divide a divider input signal on the divider input into a divider output signal on each of the at least three divider outputs, one of the first divider phase-shift circuits being configured to produce a non-zero first phase shift between divider output signals on first and second divider outputs of the first divider, and one of the second divider phase-shift circuits being configured to produce a second phase shift between the divider output signal on the first divider output and a divider output signal on a third divider output of the first divider, the second phase-shift being more than the first phase shift;
N amplifiers, each amplifier amplifying one of the N divider-network output signals into a respective amplified signal; and
a combiner network for combining the N amplified signals into a combiner-network output signal, the combiner network including at least a first combiner and at least one of each of at least first and second combiner phase-shift circuits, the first combiner having at least three combiner inputs and a combiner output and being configured to combine combiner input signals on the at least three combiner inputs into a combiner output signal on the combiner output, one of the first phase-shift circuits being configured to produce the first phase shift between combiner input signals on first and second combiner inputs of the first combiner, and one of the second phase-shift circuits being configured to produce the second phase shift between the combiner input signal on the first combiner input and a combiner input signal on a third combiner input.

24. The power divider/combiner assembly of claim 23, wherein at least one of the first and second phase shifts does not divide evenly into 360 degrees.

25. The power divider/combiner assembly of claim 23, wherein the first phase shift does not divide evenly into the second phase shift.

26. The power divider/combiner assembly of claim 23, wherein the first phase shift is less than 45 degrees.

27. The power divider/combiner assembly of claim 26, wherein the first phase shift is between 16 degrees and 30 degrees.

28. The power divider/combiner assembly of claim 23, wherein N is greater than three, the divider network further including a third divider phase-shift circuit configured to produce a third phase shift between the divider output signal on the first divider output and a divider output signal on a fourth divider output of the first divider, the third phase-shift being more than the second phase shift, and the combiner network further including a third combiner phase-shift circuit configured to produce the third phase shift between the combiner input signal on the first combiner input and a combiner input signal on a fourth combiner input of the first combiner.

29. The power divider/combiner assembly of claim 28, wherein the first phase shift is $\Delta\phi_1=180°/N+/-30\%$, the second phase shift is $\Delta\phi_2=2(180°/N)+/-30\%$, and the third phase shift is $\Delta\phi_3=3(180°/N)+/-30\%$.

30. The power divider/combiner assembly of claim 28, wherein N is greater than four, the divider network further including a fourth divider phase-shift circuit configured to produce a fourth phase shift between the divider output signal on the first divider output and a divider output signal on a fifth divider output of the first divider, the fourth phase-shift being more than the third phase shift, and the combiner network further including a fourth combiner phase-shift circuit configured to produce the fourth phase shift between the combiner input signal on the first combiner input and a combiner input signal on a fifth combiner input of the first combiner.

31. The power divider/combiner assembly of claim 30, wherein the first and second phase shifts are below 45 degrees.

32. The power divider/combiner assembly of claim 30, wherein the first phase shift is between 8 degrees and 15 degrees.

33. The power divider/combiner assembly of claim 30, wherein the first phase shift is $\Delta\phi_1=180°/N+/-30\%$, the second phase shift is $\Delta\phi_2=2(180°/N)+/-30\%$, the third phase shift is $\Delta\phi_3=3(180°/N)+/-30\%$, and the fourth phase shift is $\Delta\phi_4=4(180°/N)+/-30\%$.

* * * * *